United States Patent
Watanabe et al.

(10) Patent No.: US 11,306,884 B2
(45) Date of Patent: Apr. 19, 2022

(54) PLANAR LIGHT-EMITTING DEVICE

(71) Applicants: CITIZEN ELECTRONICS CO., LTD., Fujiyoshida (JP); CITIZEN WATCH CO., LTD., Nishitokyo (JP)

(72) Inventors: Takashi Watanabe, Fujiyoshida (JP); Kazuya Ishihara, Fujiyoshida (JP)

(73) Assignees: CITIZEN ELECTRONICS CO., LTD., Fujiyoshida (JP); CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 17/277,233

(22) PCT Filed: Dec. 3, 2019

(86) PCT No.: PCT/JP2019/047259
§ 371 (c)(1),
(2) Date: Mar. 17, 2021

(87) PCT Pub. No.: WO2020/116457
PCT Pub. Date: Jun. 11, 2020

(65) Prior Publication Data
US 2021/0356087 A1    Nov. 18, 2021

(30) Foreign Application Priority Data

Dec. 3, 2018 (JP) .............. JP2018-226893

(51) Int. Cl.
*F21S 4/28* (2016.01)
*F21V 31/00* (2006.01)
*F21Y 105/16* (2016.01)

(52) U.S. Cl.
CPC .............. *F21S 4/28* (2016.01); *F21V 31/005* (2013.01); *F21Y 2105/16* (2016.08)

(58) Field of Classification Search
CPC .... G09F 13/18; F21Y 2105/16; F21V 31/005; F21V 4/28
See application file for complete search history.

(56) References Cited

U.S. PATENT DOCUMENTS

2008/0304288 A1    12/2008    Iwasaki

FOREIGN PATENT DOCUMENTS

| JP | H10247411 A | 9/1998 |
|----|-------------|--------|
| JP | H10247412 A | 9/1998 |

(Continued)

OTHER PUBLICATIONS

International Search Report dated Feb. 18, 2020, from International Patent Application No. PCT/JP2019/047259, 5 pages.

*Primary Examiner* — Leah Simone Macchiarolo
(74) *Attorney, Agent, or Firm* — Procopio, Cory, Hargreaves & Savitch LLP

(57) ABSTRACT

A planar light-emitting device having a linear light-emitter having a substrate extending in a predetermined direction, a first line and a second line including a plurality of light-emitting elements arranged along the predetermined direction on the substrate, the first line and the second line being arranged side by site along the predetermined direction with an interval, a first frame arranged on the substrate so as to surround the first line, a second frame arranged on the substrate so as to surround the second line, a first seal arranged inside the first frame for sealing the plurality of light-emitting elements, a second seal arranged inside the second frame for sealing the plurality of light-emitting elements, and a plurality of electrodes arranged on the substrate and electrically connected with the plurality of light-emitting elements, and a light guide plate having an incidence surface having a first flat portion facing to the first line, a second flat portion facing to the second line, a projecting portion arranged between the first flat portion and (Continued)

the second flat portion and projecting toward the linear light-emitter, and an emission surface emitting light incident from the incidence surface, wherein the projecting portion has a first light-incoming surface arranged at an angle so as to face to an end portion of the first frame on the second frame side, and a second light-incoming surface arranged at an angle so as to face to an end portion of the second frame on the first frame side.

10 Claims, 22 Drawing Sheets

(56) References Cited

FOREIGN PATENT DOCUMENTS

| | | |
|---|---|---|
| JP | 2000030520 A | 1/2000 |
| JP | 2008305713 A | 12/2008 |
| JP | 2010146931 A | 7/2010 |
| JP | 2017050342 A | 3/2017 |

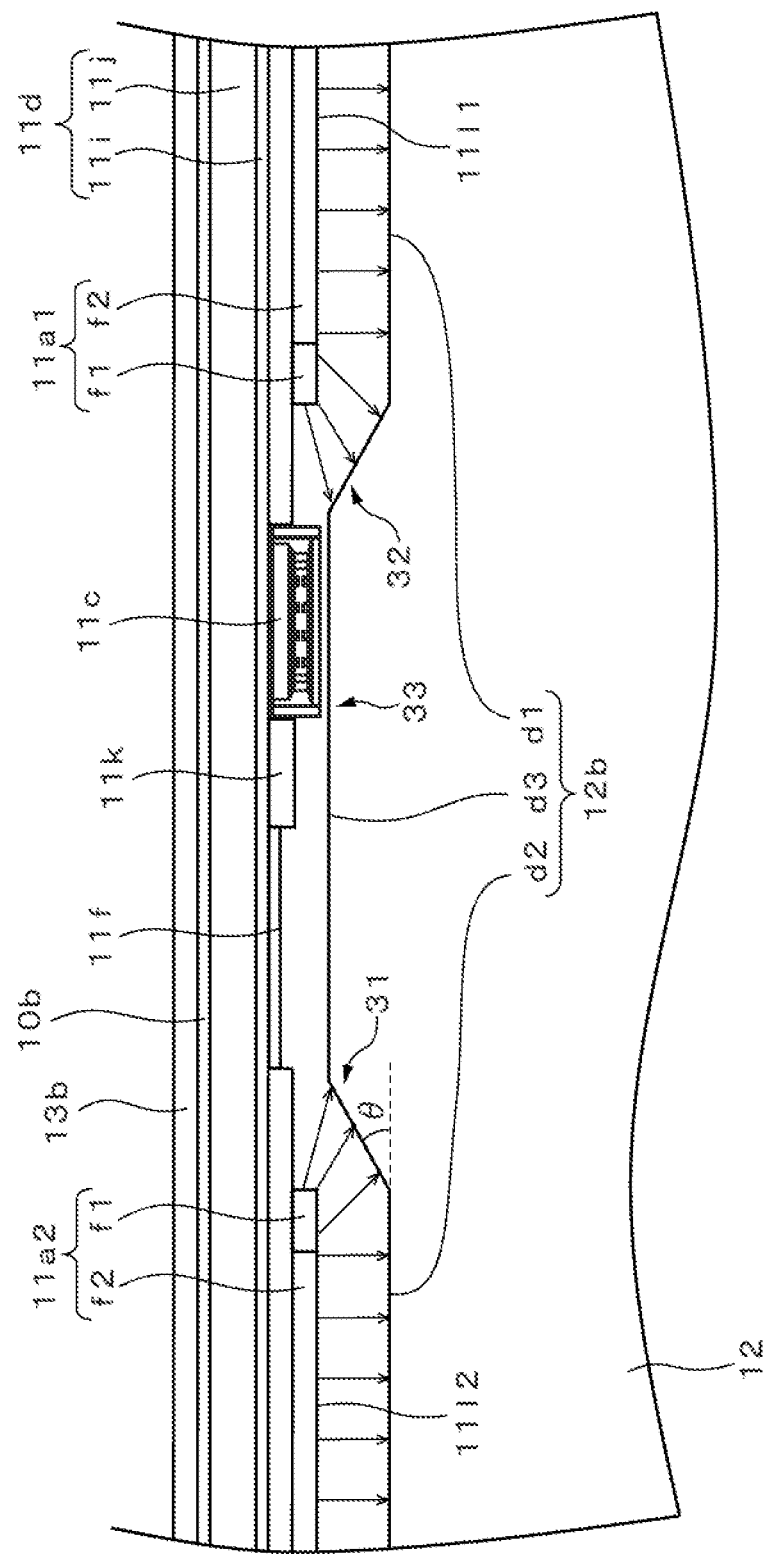

PLANAR LIGHT-EMITTING DEVICE

FIELD

The present disclosure relates to a planar light-emitting device.

BACKGROUND

Conventionally, a planar light-emitting device emitting planar light is used as a light source in a transmission-type display panel device such as a liquid crystal panel device, an illuminating device such as a ceiling light, and an information display device such as a digital signage.

Display panel devices and the information display devices for displaying various kinds of information may be used in the bright outdoors with sunlight. Further, when an illuminating device is used in a wide room, the illuminating device may be required to radiate light having high luminance so that corners of the room are illuminated.

For example, a transmission-type display panel device such as a liquid crystal panel device is used as a display of a high-functionality mobile terminal and may be used in various environments.

A planar light-emitting device that illuminates the transmission-type display panel such as a liquid crystal panel from the backside is referred to as a backlight device, since the planar light-emitting device illuminates the transmission-type display panel from the backside.

The backlight device is used for forming an image by illuminating the transmission-type display panel device such as a liquid crystal panel from the backside.

Two types of planar light-emitting devices are known, i.e., one is an edge-type planar light-emitting device having an incidence surface on which light emitted from a light-emitting device is incident and an emission surface from which the incident light, and is arranged substantially perpendicular to the incidence surface, and another is a direct-type planar light-emitting device having an incidence surface and an emission surface arranged so as to oppose each other.

The edge-type planar light-emitting device has a light guide plate having one or more side surfaces used as an incidence surface arranged so as to face to the light-emitting area of a light-emitting device. The light incident from the incidence surface propagates within the light guide plate and is emitted from the emission surface arranged substantially perpendicular to the incidence surface. The light guide plate having one or more side surfaces has long sides and short sides and the long sides are used as the incidence surface. The edge-type planar light-emitting devices have a linear light-emitter arranged so as to face to the incidence surface extending in the longitudinal direction of the light guide plate as a light source.

For example, the linear light-emitter is described in FIG. 1 of Japanese Unexamined Patent Publication No. 2010-146931 having three packages in which four LED chips are mounted on a lead frame and a linear insulation substrate to which the three packages are attached linearly. Further, an edge-type planar illuminating device having the linear light-emitter is described in FIG. 5 of Japanese Unexamined Patent Publication No. 2010-146931.

SUMMARY

In recent years, it is required to further improve luminance of light emitted by a backlight device in order to secure sufficient visual recognizability of the display panel device under a bright environment, such as outdoors.

When the number of LED chips of the linear light-emitter is increased, the luminance thereof may be improved.

However, the length of the insulation substrate is limited in the linear light-emitter described in Japanese Unexamined Patent Publication No. 2010-146931, and therefore it is not easy to increase the number of packages to be attached to the insulation substrate. Further, the number of LED chips mounted on one package is restricted by heat dissipation and machining accuracy of a lead frame, and therefore it is also difficult to considerably increase the number of mounted LED chips.

For example, it is required to improve luminance of the planar light-emitting device in illuminating devices and information display devices, similar to display panel devices, as described in Japanese Unexamined Patent Publication No. 2013-214362.

An object of the present specification is to provide a planar light-emitting device capable of emitting light having high luminance.

A planar light-emitting device having a linear light-emitter having a substrate extending in a predetermined direction, a first line and a second line including a plurality of light-emitting elements arranged along the predetermined direction on the substrate, the first line and the second line being arranged side by site along the predetermined direction with an interval, a first frame arranged on the substrate so as to surround the first line, a second frame arranged on the substrate so as to surround the second line, a first seal arranged inside the first frame for sealing the plurality of light-emitting elements, a second seal arranged inside the second frame for sealing the plurality of light-emitting elements, and a plurality of electrodes arranged on the substrate and electrically connected with the plurality of light-emitting elements, and a light guide plate having an incidence surface having a first flat portion facing to the first line, a second flat portion facing to the second line, a projecting portion arranged between the first flat portion and the second flat portion and projecting toward the linear light-emitter, and an emission surface emitting light incident from the incidence surface, wherein the projecting portion has a first light-incoming surface arranged at an angle so as to face to an end portion of the first frame on the second frame side, and a second light-incoming surface arranged at an angle so as to face to an end portion of the second frame on the first frame side.

It is preferable in the planar light-emitting device that that an inner area of the first frame defines a first light-emitting area of the linear light-emitter and an inner area of the second frame defines a second light-emitting area of the linear light-emitter.

It is preferable in the planar light-emitting device that the projecting portion is arranged so as to be close to an area between the first light-emitting area and the second light-emitting area.

It is preferable in the planar light-emitting device that the projecting portion is arranged so as to be contacted with an area between the first light-emitting area and the second light-emitting area.

It is preferable in the planar light-emitting device that the height of the projecting portion is higher than heights of the first frame and the second frame.

It is preferable in the planar light-emitting device that the first frame and the second frame have a shape extending in the predetermined direction, the first frame includes a first portion arranged near one end portion close to the second frame in the predetermined direction and a second portion arranged near another end portion far from the second frame in the predetermined direction and transmittance of light of the first portion is higher than transmittance of the second portion, and the second frame includes a third portion arranged near one end portion close to the first frame in the predetermined direction and a fourth portion arranged near another end portion far from the first frame in the predetermined direction and transmittance of light of the third portion is higher than transmittance of the fourth portion.

It is preferable in the planar light-emitting device that light-emission intensity of a first area of the first light-emitting area far from the second light-emitting are, is lower than light-emission intensity of a second area of the first light-emitting area closer to the second light-emitting area than the first light-emitting area and light-emission intensity of a third area of the second light-emitting area close to the first light-emitting area, is higher than light-emission intensity of a fourth area of the second light-emitting area far from the first light-emitting area than the third area.

It is preferable in the planar light-emitting device that the plurality of light-emitting elements included in the first line and the second line forms rows arranged side by side in the predetermined direction and in the rows, intervals between the light-emitting elements are different at least partially.

It is preferable in the planar light-emitting device that in the first line, a first interval between the light-emitting elements arranged in the first area is longer than a second interval between the light-emitting elements arranged in the second area and in the second line, a third interval between the light-emitting elements arranged in the third area is narrower than a fourth interval between the light-emitting elements arranged in the fourth area.

It is preferable in the planar light-emitting device that a height of the first frame is higher than a position of a surface of the first seal, and a height of the second frame is greater than a position of a surface of the second seal.

The above planar light-emitting device disclosed in the present specification may emit light of high luminance.

BRIEF DESCRIPTION OF THE DRAWINGS

FIG. 8 is an enlarged plan diagram of a main part in FIG. 3;

DESCRIPTION OF EMBODIMENTS

In the following, one preferred embodiment of the planar light-emitting device disclosed in the present specification is explained with reference to the drawings. However, the technical scope of the present invention is not limited to the embodiment and encompasses the invention described in the claims and the equivalents thereof.

In the present specification, although planar light-emitting devices are explained as a light source that illuminates transmission-type display panel such as a liquid crystal panel from the backside, usages of the planar light-emitting devices disclosed in the present specification are not limited to such a usage. For example, the planar light-emitting devices may be used as a light source of illuminating devices and information display devices.

Figure 1:
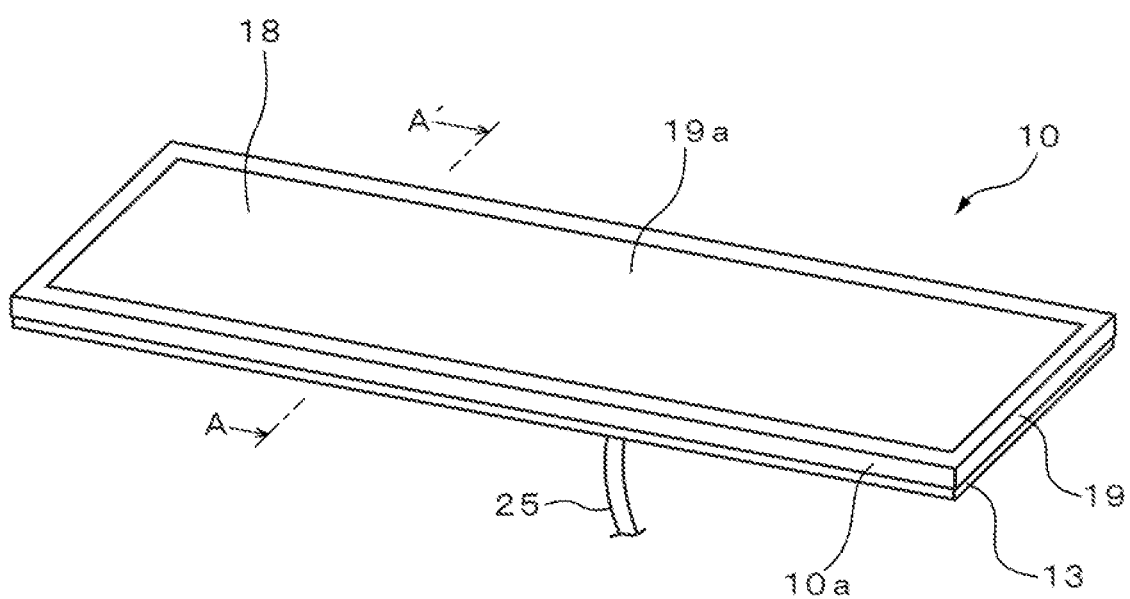
FIG. 1 is a perspective diagram of one embodiment of the planar light-emitting device disclosed in the present specification.
Figure 2:
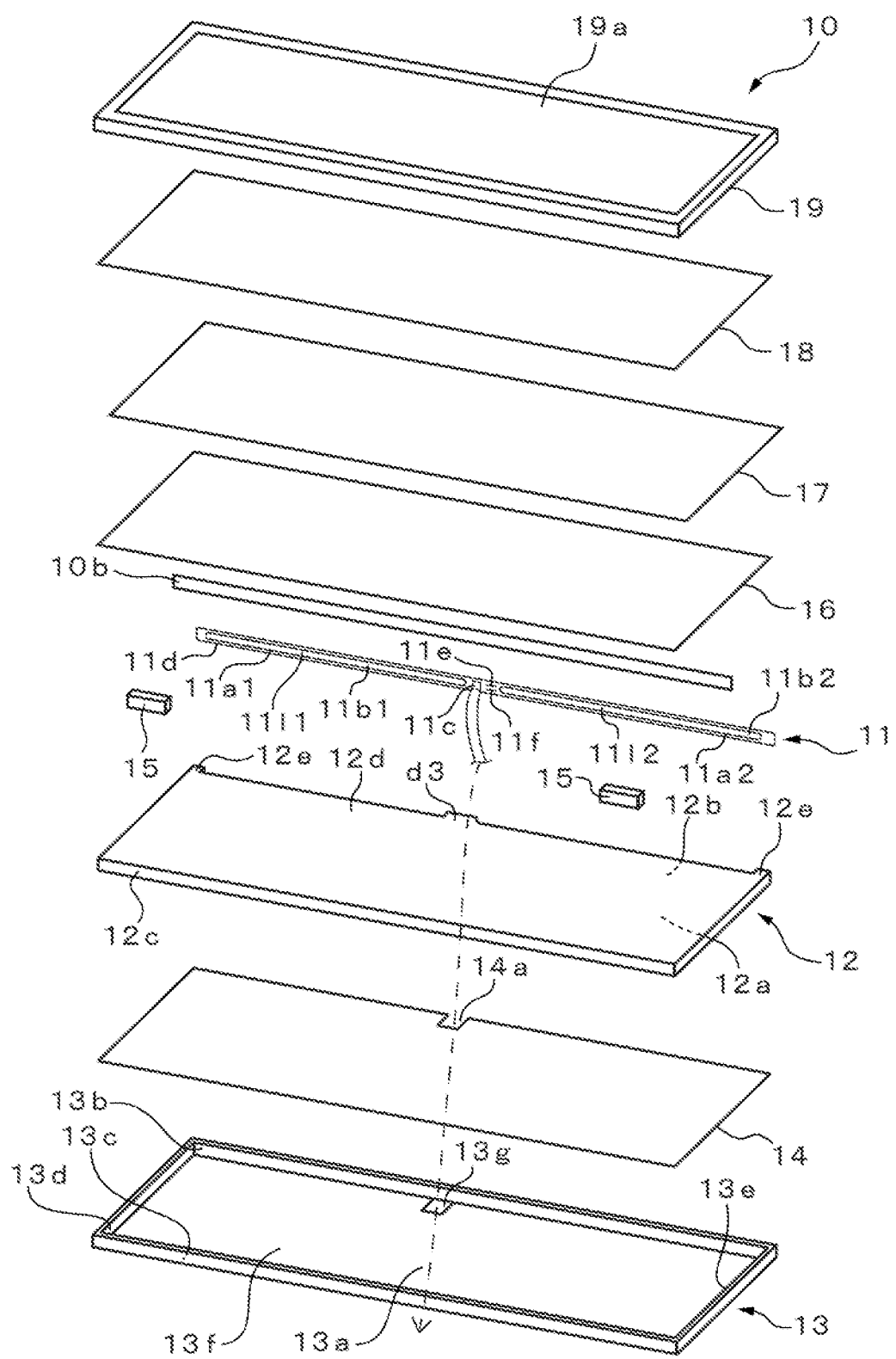
FIG. 2 is an exploded perspective diagram of one embodiment of the planar light-emitting device disclosed in the present specification.
Figure 3:
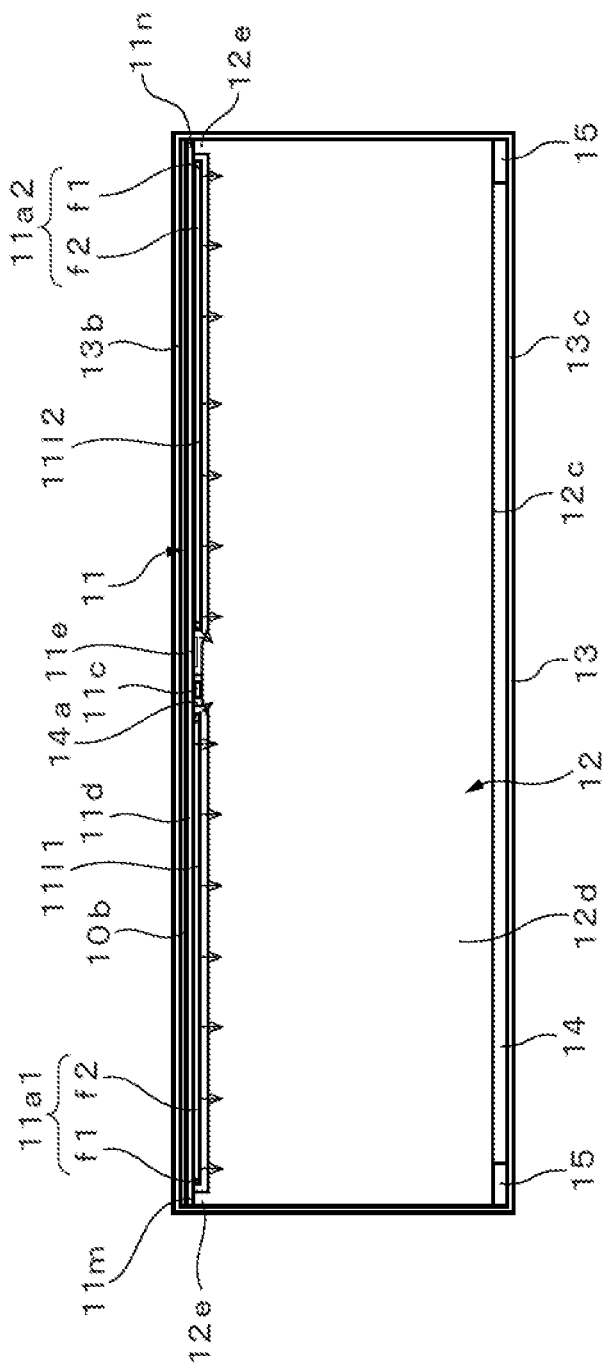
FIG. 3 is a plan diagram of n main part of one embodiment of the planar light-emitting device disclosed in the present specification.
Figure 4:
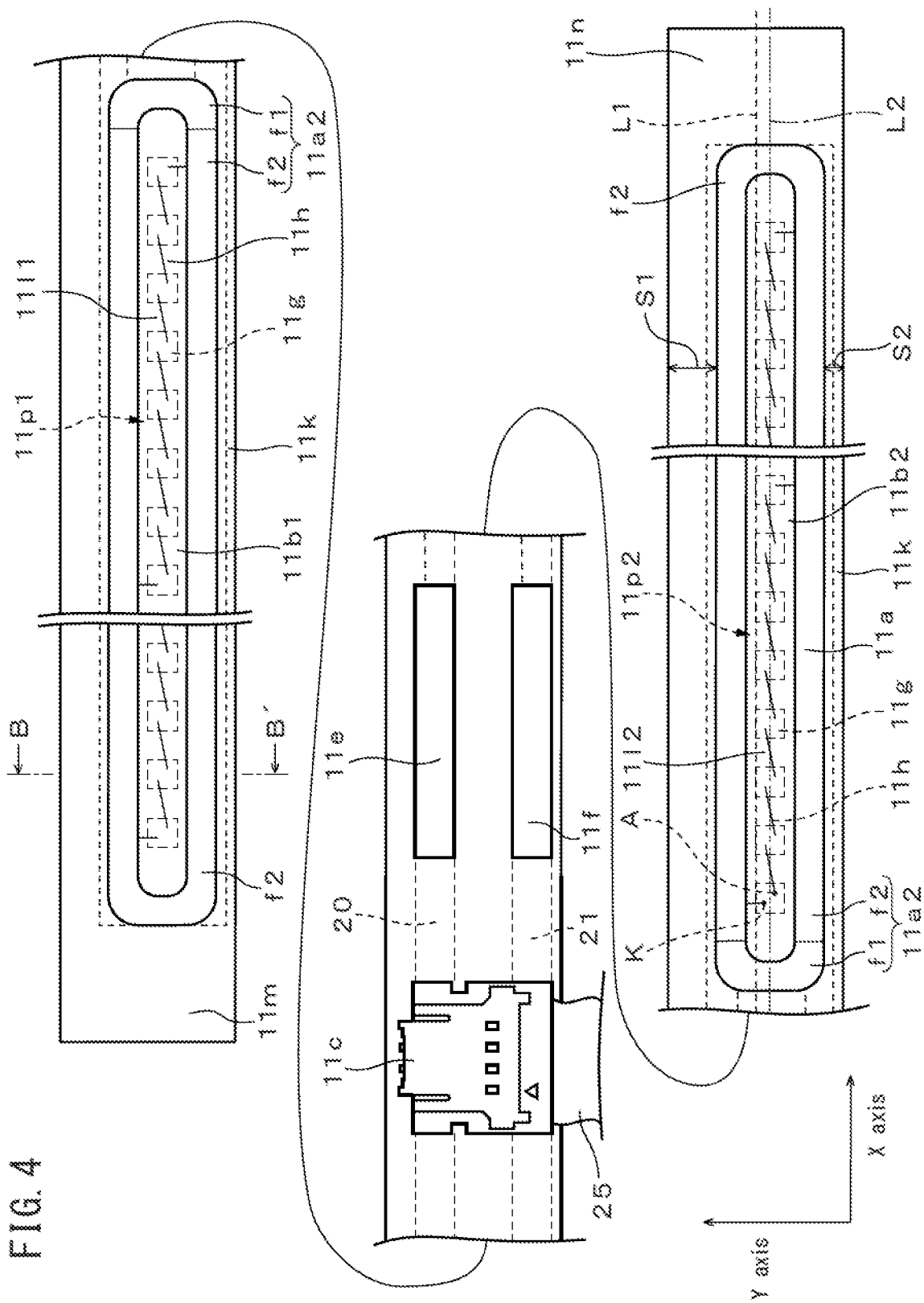
FIG. 4 is an enlarged plan diagram of the linear light-emitter of one embodiment of the planar light-emitting device disclosed in the present specification.
Figure 5:
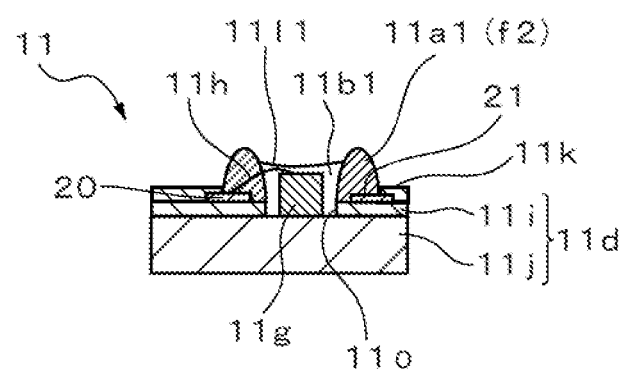
FIG. 5 is a cross-sectional diagram along a B-B' line in FIG. 4.
Figure 6:
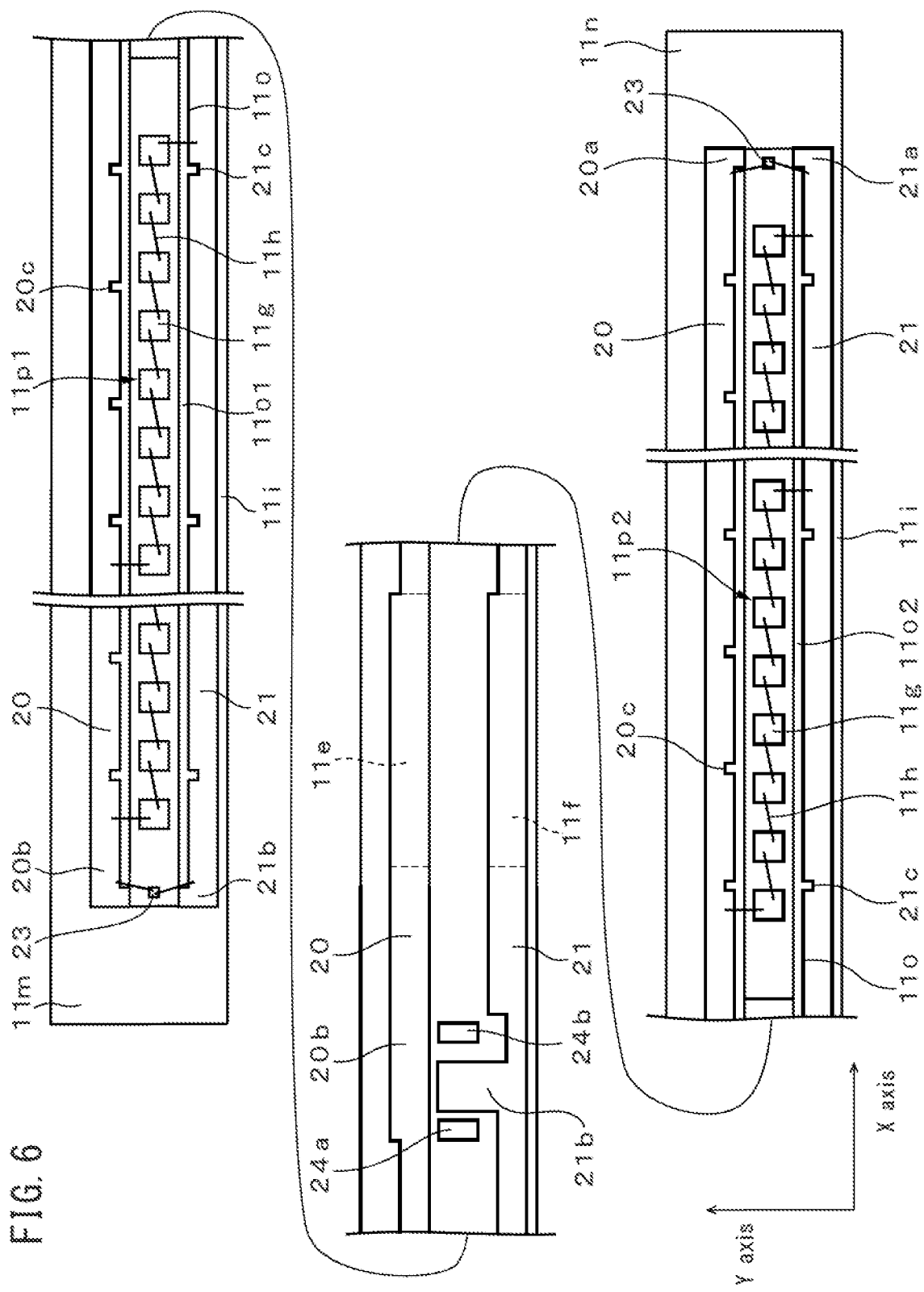
FIG. 6 is an enlarged plan diagram of a wiring portion of the linear light-emitter of one embodiment of the planar light-emitting device disclosed in the present specification.
Figure 7A:
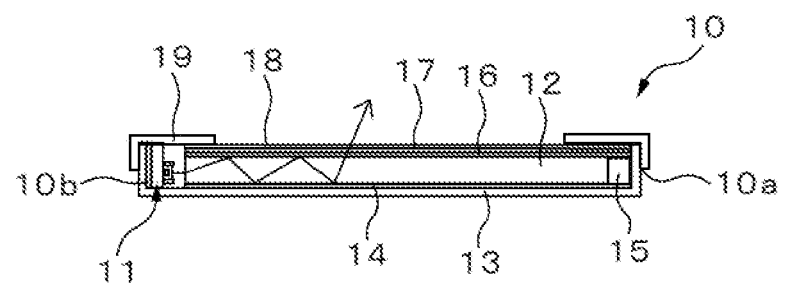
FIG. 7A is an enlarged cross-sectional diagram along an A-A' line in FIG. 1.
Figure 7B:
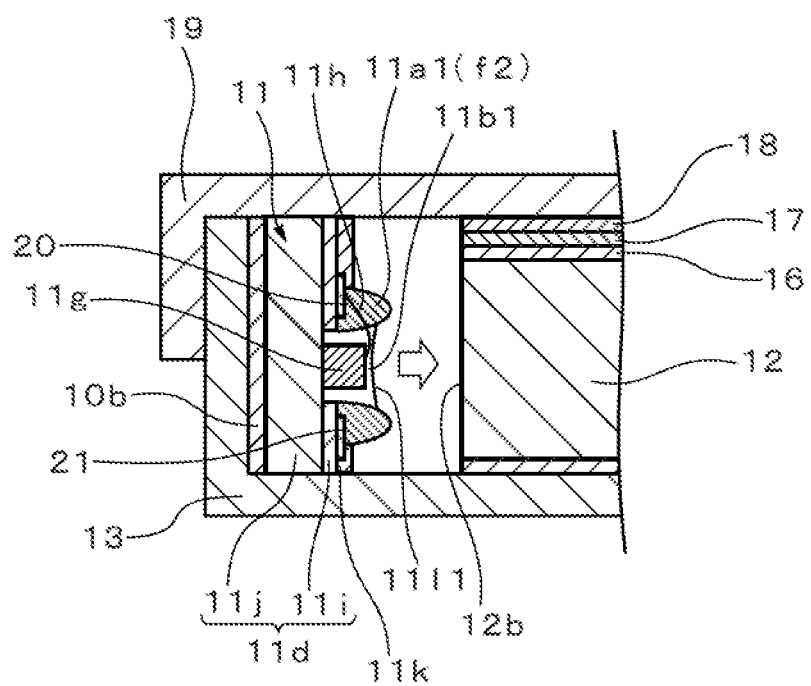
FIG. 7B is an enlarged diagram of a main part in FIG. 7A.

FIG. 1 is a perspective diagram of one embodiment of the planar light-emitting device disclosed in the present specification. FIG. 2 is an exploded perspective diagram of one embodiment of the planar light-emitting device disclosed in the present specification. FIG. 3 is a plan diagram of n main part of one embodiment of the planar light-emitting device disclosed in the present specification. FIG. 4 is an enlarged plan diagram of the linear light-emitter of one embodiment of the planar light-emitting device disclosed in the present specification. FIG. 5 is a cross-sectional diagram along a B-B' line in FIG. 4. FIG. 6 is an enlarged plan diagram of a wiring portion of the linear light-emitter of one embodiment of the planar light-emitting device disclosed in the present specification. FIG. 7A is an enlarged cross-sectional diagram along an A-A' line in FIG. 1, and FIG. 7B is an enlarged diagram of a main part in FIG. 7A. FIG. 8 is an enlarged plan diagram of a main part in FIG. 3.

A planar light-emitting device 10 of the present embodiment has a linear light-emitter 11, a light guide plate 12, a reflection sheet 14, a spacer 15, a diffusion sheet 16, a light-condensing sheet 17, a reflection-type polarizing plate 18 and a storage case 10a internally storing the linear light-emitter 11 to the reflection-type polarizing plate 18. The planar light-emitting device 10 has a flat cuboid shape extending in a predetermined direction.

The lower case 13 has a bottom 13a and four sides 13b, 13c, 13d and 13e. A space 13f is surrounded by the bottom 13a and the four sides 13b, 13c, 13d and 13e, so that the space 13f is formed. The upper portion of the space 13f is exposed to an outside.

An upper case 19 is arranged on the lower case 13 so as to cover the space 13f, and therefore the storage case 10a is formed.

The bottom 13a of the lower case 13 has a rectangle shape. The outer shapes of the light guide plane 12, the reflection sheet 14, the diffusion sheet 16, the light-condensing sheet 17 and the reflection-type polarizing plate 18 substantially match with that of the bottom 13a.

The reflection sheet 14 is arranged on the bottom 13a. Further, the light guide plate 12, the diffusion sheet 16, the light-condensing sheet 17 and the reflection-type polarizing plate 18 are arranged on the reflection sheet 14 in the above order so that the outer shapes thereof are substantially matched, and the upper case 19 is arranged on the lower case 13 so as to cover the reflection-type polarizing plate 18.

The upper case 19 has a large opening 19a and the reflection-type polarizing plate 18 is exposed from the opening 19a. The planar light emitted from the linear light-emitter 11 is emitted to the outside of the planar light-emitting device 10 from the opening 19a.

The light guide plate 12 has an incidence surface 12b on which light emitted from the linear light-emitter 11 is incident, an emission surface 12d from which the light incident from the incidence surface 12b is emitted, a reflection surface 12a opposite to the emission surface 12d, and an opposite surface 12c opposite to the incidence surface 12b. The light guide plate 12 has a flat cuboid shape extending in the longitudinal direction of the planar light-emitting device 10. The light guide plate 12 guides the light incident from the incidence surface 12b, by changing propagating directions of the light, and emits the light from the emission surface 12d having a substantially rectangle shape and perpendicular to the incidence surface 12b. The light guide plate 12 is made of a material that propagates the light emitted from the linear light-emitter 11. The light guide plate 12 is made of a resin, for example, such as a polycarbonate resin or an acryl resin. Further, the light guide plate 12 may receive light having high luminance from the linear light-emitter 11, and therefore the light guide plate 12 may be made of a material having high light tolerance. A glass may be used as the material having high light.

The incidence surface 12b has a rectangle shape extending in the longitudinal direction of the light guide plate 12. Protruding portions 12e are arranged both sides in the longitudinal direction of the incidence surface 12b. The linear light-emitter 11 is arranged in a space surrounded by a pair of the protruding portions 12e and the incidence surface 12b within the lower case 13.

Fine convexo-concave structures are provided on the reflection surface 12a of the light guide plate 12. The propagating direction of the light incident on the reflection surface 12a in the light guide plate 12 is changed to the direction toward the emission surface 12d by the convexo-concave structures and is emitted from the emission surface 12d.

The shape of the light guide plate 12 is not limited to a rectangle extending in the longitudinal direction. The shape of the light guide plate 12 may be determined appropriately in accordance with the plane shape of the light emitted from an apparatus incorporated in the planar light-emitting device 10. For example, the light guide plate 12 may have polygon shapes other than a square and a rectangle and an ellipse shape. Further, for example, when the planar light-emitting device 10 is used as the light source of an illuminating device, the light guide plate 12 may have a circle, ellipse and polygon shape.

The linear light-emitter 11 has an elongated rectangle shape extending in the longitudinal direction of the planar light-emitting device 10. The linear light-emitter 11 has a substrate 11d having a mount substrate 11j and a circuit substrate 11i, and first light-emitting element line 11p1 and second light-emitting element line 11p2 including a plurality of light-emitting elements 11g. The linear light-emitter 11 further has a first frame 11a1 arranged on the mount substrate 11j so as to surround the first light-emitting element line 11p1 and a second frame 11a2 arranged on the mount substrate 11j so as to surround the second light-emitting element line 11p2. The linear light-emitter 11 further has a first seal 11b1 arranged inside the first frame 11a1 for sealing the plurality of the light-emitting elements 11g and a second seal 11b2 arranged inside the second frame 11a2 for sealing the plurality of the light-emitting elements 11g. The linear light-emitter 11 has a connector 11c and inspection electrodes 11e and 11f arranged on the mount substrate 11j between the first frame 11a1 and the second frame 11a2. The connector 11c supplies power supplied from an external power source to the plurality of the light-emitting elements 11g of the first light-emitting element line 11p1 and the second light-emitting element line 11p2. As shown in FIG. 4, the longitudinal direction of the linear light-emitter 11 is referred to as an X-axis direction. Further, the width direction perpendicular to the longitudinal direction of the linear light-emitter 11 is referred to as a Y-axis direction. Furthermore, the first light-emitting element line 11p1 and the second light-emitting element line 11p2 are referred to as the first line and the second line, respectively.

In A first light-emitting area 11l1, the connector 11c, the inspection electrodes 11e and 11f, and a second light-emitting area 11l2 are arranged in the above order in the longitudinal direction of the linear light-emitter 11 from a first end portion 11m to a second end portion 11n.

The surface of the first seal 11b1 surrounded by the first frame 11a1 forms the first light-emitting area 11l1 emitting light. Similarly, the surface of the second seal 11b2 surrounded by the second frame 11a2 forms a second light-emitting area 11l2 emitting light. In other words, the inner area of the first frame 11a1 defines the first light-emitting area 11l1 of the linear light-emitter 11, and the inner area of the second frame 11a2 defines the second light-emitting area 11l2 of the linear light-emitter 11.

As shown in FIGS. 3 and 8, the incidence surface 12b of the light guide plate 12 has a first flat portion d1 facing to the first light-emitting element line 11p1 within the first frame 11a1, a second flat portion d2 facing to the second light-emitting element line 11p2 within the second frame 11a1, and a projecting portion d3. The first flat portion d1 has a flat surface and the interval between the first flat portion d1 and the first frame 11a1 is substantially constant. The second flat portion d2 has a flat surface and the interval between the second flat portion d2 and the second frame 11a2 is substantially constant. The projecting portion d3 projects toward the linear light-emitter 11 compared to the first flat portion d1 and the second flat portion d2, and is arranged so as to be close to the area between the first frame 11a1 and the second frame 11a2.

The projecting portion d3 has a first light-incoming surface d31, a second light-incoming surface d32, and a tip portion d33, and projects toward the connector 11c and the inspection electrodes 11e and 11f. The first light-incoming surface d31 faces to a first portion f1 that is an end portion of the first frame 11a1 on the second frame 11a2 side, and is arranged at an angle from one end of the first flat portion d1 so that the light emitted from the plurality of the light-emitting elements 11g included in the first light-emitting element line 11p1 is incident thereon. The second light-incoming surface d32 faces to the first portion f1 that is an end portion of the second frame 11a2 on the first frame 11a1 side, and arranged at an angle from one end of the second flat portion d2 so that the light emitted from the plurality of the light-emitting elements 11g included in the second light-emitting element line 11p2 is incident thereon. The tip portion d33 extends between one end of the first light-incoming surface and one end of the second light-incoming surface, and in parallel to the first and second flat portions d1 and d2. Since the first light-incoming surface d31 and the second light-incoming surface d32 extend at an angle from the extending direction of the first flat portion d1 and the second flat portion d2, the projecting portion d3 has a taper shape. Further, the height of the projecting portion d3 is greater than those of the first and second frames 11a1 and 11a2.

It is preferable that an inclination angle θ between the extending direction of the first and second light-incoming surfaces d31 and d32 and the extending direction of the first and second flat portions d1 and d2 is not less than 30° and not more than 70°. If the inclination angle θ is less than 30°, the width of the projecting portion d3 increases and dark portions may occur in the projecting portion d3 and on the periphery of the projecting portion d3. If the inclination angle θ is larger than 70°, a sufficient amount of light is not incident on the projecting portion d3 and dark portions may occur in the projecting portion d3 and on the periphery of the projecting portion d3.

The first light-emitting area 11/1 is arranged between the protruding portion 12e on the first end portion 11m side and the projecting portion d3. The protruding portion 12e has a side surface extending in the direction perpendicular to the incidence surface 12b of the light guide plate 12. On the other hand, the projecting portion d3 has the first light-incoming surface d31 extending at an angle from the incidence surface 12b of the light guide plate 12. The side surface of the first flat portion d1 extends in the direction perpendicular to the incidence surface 12b and the first light-incoming surface d31 extends at an angle from the incidence surface 12b, and therefore the first light-emitting area 11/1 is arranged so as to be surrounded by the convex projecting from the incidence surface 12b of the light guide plate 12 and having an asymmetrical shape. Similarly, the second light-emitting area 11/2 is arranged so as to be surrounded by the convex projecting from the incidence surface 12b of the light guide plate 12 and having an asymmetrical shape.

Although the projecting portion d3 facing to the connector 11c and the inspection electrodes 11e and 11f does not face to the first light-emitting area 11/1 and the second light-emitting area 11/2 facing to the first flat portion d1 and the second flat portion d2, the projecting portion d3 is irradiated with light from the first light-incoming surface d31 and the second light-incoming surface d32.

Further, since the incidence surface 12b has the projecting portion d3, the incidence surface 12b may receive a more amount of the light emitted from the first light-emitting element line 11p1 and the second light-emitting element line 11p2 compared to an incidence surface without the projecting portion d3 between the first flat portion d1 and the second flat portion d2.

The planar light-emitting device 10 may improve uniformity of the planar light emitted from the emission surface 12d of the light guide plate 12, since the difference of light amount between the light incident on the projecting portion d3 of the incidence surface 12b and the light incident on the first flat portion d1 and the second flat portion d2 is small.

For example, the dimension in the longitudinal direction of the linear light-emitter 11 may be about 340 mm, the dimension in the width direction thereof may be about 4 mm, and the thickness of the linear light-emitter 11 may be about 1.4 mm.

The mount substrate 11j has an elongated rectangle shape. The longitudinal direction of the mount substrate 11j matches with that of the linear light-emitter 11, and the width direction of the mount substrate 11j matches with that of the linear light-emitter 11. The mount substrate 11j is made of, for example, a metal such as aluminum, or an electrically insulating material such as ceramics. The mount substrate 11j has a flat surface and a plurality of the light-emitting elements 11g is arranged on the flat surface. The plurality of the light-emitting elements 11g may be arranged on the mount substrate 11j in a high density, by flattening the surface of the mount substrate 11j.

For example, the thickness of the mount substrate 11j may be about 0.9 mm.

The circuit substrate 11i has the same outer line as that of the mount substrate 11j, and is arranged on the mount substrate 11j. The longitudinal direction of the circuit substrate 11i matches with that of the linear light-emitter 11, and the width direction of the circuit substrate 11i matches with that of the linear light-emitter 11.

The circuit substrate 11i has two elongated openings, i.e., a first opening 11o1 and a second opening 11o2 arranged side by side in the longitudinal direction at the center in the width direction. Flat surfaces of the mount substrate 11j are exposed from the first opening 11o1 and the second opening 11o2. The circuit substrate 11i is adhered on the mount substrate 11j by an adhesive material, such as an adhesive sheet. The circuit substrate 11i is made of an electrically insulating resin, such as a phenol resin, an epoxy resin, a polyimide resin, and a polyester resin.

As shown in FIG. 6, a pair of wiring portions 20 and 21 is arranged on the front surface of the circuit substrate 11i so as to sandwich the first opening 11o1 and the second opening 11o2. The pair of the wiring portions 20 and 21 is arranged at an interval in the width direction of the circuit substrate 11i so as to extend in the longitudinal direction of the circuit substrate 11i. The wiring portions 20 and 21 are made of, for example, an electrical conductor, such as gold or copper, and patterned on the circuit substrate 11i. The wiring portions 20 and 21 function as electrodes electrically connected with the plurality of the light-emitting elements 11g. Power is supplied from the outside via the connector 11c to the wiring portion 20 and 21.

The plurality of the light-emitting elements 11g are arranged between the wiring portions 20 and 21 along the longitudinal direction of the linear light-emitter 11.

The connector 11c is arranged at centers 20d and 21d in the longitudinal direction in the wiring portions 20 and 21. The connector 11 supplies power supplied from an external power source (not shown) to the wiring portions 20 and 21. Further, joint pads 24a and 24b for joining the connector 11 to the mount substrate 11j by using solder and etc., are arranged adjacent to the centers 20d and 21d in the longitudinal direction in the wiring portions 20 and 21.

As shown in FIG. 6, end portions 20b and 21b on the first end portion 11m side of the wiring portions 20 and 21 are connected electrically via a zener diode 23. Similarly, end portions 20a and 21a on the second end portion 11n side n the wiring portions 20 and 21 are connected electrically via a zener diode 23. The zener diodes 23 prevents an overvoltage from being applied to the plurality of the light-emitting elements 11g by discharging a zener voltage when an overvoltage is applied between the wiring portions 20 and 21.

Further, the inspection electrodes 11e and 11f are arranged adjacent to the connector 11c, at the centers 20d and 21d in the longitudinal direction of the wiring portions 20 and 21. The inspection electrodes 11e and 11f are used to apply a voltage for inspecting the operation of the linear light-emitter 11 in the manufacturing process.

Power is supplied from an external power source to the connector 11c via a cable 25. The cable 25 connected with the connector 11c may extend to the outside via an opening 14a of the reflection sheet 14 and an opening 13g on the bottom 13a of the lower case 13.

A plurality of concave portions 21c are arranged at the wiring portion 21, and function as a marker when the light-emitting elements 11g are arranging on the mount substrate 11j.

Further, a plurality of concave portions 20c are arranged at the wiring portion 20, and function as a marker when wires 11h are arranged on the mount substrate 11j.

The circuit substrate 11i and the wiring portions 20 and 21 are protected by a solder resist 11k that is an insulating film, except for the areas on which the connector 11c is arranged and the inspection electrodes 11e and 11f are covered.

The light-emitting element 11g is, for example, a semiconductor light-emitting element emitting blue light and having a rectangle shape. The light-emitting element 11g is, for example, an LED die. The LED dies are elements having cathode terminal and anode terminal electrically connected. The plurality of the light-emitting elements 11g are linearly arranged along the longitudinal direction of the linear light-emitter 11 on the mount substrate 11j within the first opening 11o1 of the circuit substrate ill. The plurality of the light-emitting elements 11g form first light-emitting element line 11p1 arranged side by side in the longitudinal direction of the linear light-emitter 11. Similarly, the plurality of the light-emitting elements 11g form second light-emitting element line 11p1 arranged side by side in the longitudinal direction of the linear light-emitter 11. The first light-emitting element line 11p1 and the second light-emitting element line 11p2 are arranged so as to sandwich the connector 11c and the inspection electrodes 11e and 11f in the longitudinal direction of the linear light-emitter 11.

It is preferable that the light-emitting elements 11g are arranged so that the top surfaces of the light-emitting elements 11g are parallel to the front surface of the mount substrate 11j. The light-emitting elements 11g are bonded onto the mount substrate 11j by die bonding. For example, an InGaN-based compound semiconductor having light-emission wavelength range from 440 to 455 nm may be used as the light-emitting element 11g. In FIG. 4, although the rectangular light-emitting elements 11g are arranged on the mount substrate 11j so that the sides of the light-emitting elements 11g face each other, the light-emitting elements 11g may arrange on the mount substrate 11j so that the corners of the light-emitting elements 11g face each other by rotating the light-emitting elements 11g at 45 degrees.

The rise in temperature of the light-emitting elements 11g is suppressed, since the light-emitting elements 11g are arranged directly on the mount substrate 11j, and therefore heat produced by the light-emitting elements 11g emitting light is efficiently transmitted to the mount substrate 11j. The light-emitting elements 11g in the linear light-emitter 11 may be arrange on the mount substrate 11j in a high density, since the light-emitting element 11g are directly mounted on the mount substrate 11j, and therefore the heat produced by the light-emitting elements 11g is efficiently radiated from the mount substrate 11j.

The light-emitting element 11g has a cathode terminal K and an anode terminal A. The cathode terminals K and the anode terminals A of the adjacent light-emitting elements 11g are electrically connected to each other by using the wires 11h. The plurality of the light-emitting elements 11g are electrically connected and form one line. The cathode terminal K and the anode terminal A of the light-emitting elements 11g located at both ends of each line are electrically connected to the wiring portions 20 and 21 via the wires 11h.

In the first and second light-emitting element lines 11p1 and 11p2, thirteen light-emitting element groups in which the eight light-emitting elements 11g are connected in series is connected in parallel between the wiring portions 20 and 21. In other words, each of the first light-emitting element line 11p1 and the second light-emitting element line 11p2 has the 104 light-emitting elements 11g. Although the wires 11h are sealed by the seal 11b, the wires 11h are indicated by a solid line in FIG. 6 for easier understanding.

When a direct-current voltage is applied to the wiring portions 20 and 21 from an external power source via the connector 11c, the light-emitting elements 11g emit light.

In the linear light-emitter 11, the plurality of the light-emitting elements 11g are arranged directly on the mount substrate 11j, and therefore a large number of light-emitting elements 11g may be arranged per unit length in the longitudinal direction of the linear light-emitter 11.

The number of light-emitting elements 11g arranged in a group may be determined appropriately in accordance with a voltage from a drive circuit. Further, the number of groups arranged in the linear light-emitter 11 may be determined appropriately in accordance with luminance required for a planar light-emitting device.

For example, the dimensions of the light-emitting element 11g in planar view may be about 0.6 mm×0.6 mm. Further, the interval between the adjacent light-emitting elements 11g may be about 1.4 mm. When the front surface of the mount substrate 11j arranging the light-emitting elements 11g is flat, the interval between the adjacent light-emitting elements 11g may be about 0.1 mm.

The first frame 11a1 is arranged along the first opening 11o1 of the circuit substrate 11i so as to surround the plurality of the light-emitting elements 11g linearly arranged. The longitudinal direction of the first frame 11a1 matches with that of the linear light-emitter 11. The width direction of the first frame 11a1 matches with that of the linear light-emitter 11. The first frame 11a1 has a ring shape extending in the longitudinal direction of the linear light-emitter 11. The first frame 11a1 is referred to as a dam.

The first frame 11a1 is long continua arranged in the form of a ring and having substantially uniform width.

The second frame 11a2 is arranged along the second opening 11o2 of the circuit substrate 11i so as to surround the plurality of the light-emitting elements 11g linearly arranged. The longitudinal direction of the second frame 11a2 matches with that of the linear light-emitter 11. The width direction of the second body 11a2 matches with that of the linear light-emitter 11. The second frame 11a2 has a ring shape extending in the longitudinal direction of the linear light-emitter 11. The second frame 11a2 is referred to as a dam.

The second frame 11a2 is long continua arranged in the form of a ring and having substantially uniform width.

As shown in FIG. 8, the connector 11c and the inspection electrodes 11e and 11f are arranged between the first frame 11a1 and the second frame 11a2. The projecting portion d3 of the light guide plate 12 is arranged so as to face to the connector 11c and the inspection electrodes 11e and 11f. The distance between the projecting portion d3 and the first light-emitting area 11/1 within the first frame 11a1 or the second light-emitting area 11/2 within the second frame 11a2 is longer than the distances between the first flat portion d1 and the first and second light-emitting areas 11/1 and 11/2. The amount of light incident on the projecting portion d3 is smaller than the amount of light incident on the first and second flat portions d1 and d2, and therefore the light intensity at the center in the longitudinal direction may be lower than those on both sides in the longitudinal direction on the emission surface 12d of the light guide plate 12. In the linear light-emitter 11 of the present embodiment, as will be explained below, the projecting portion d3 is also irradiated sufficiently with light.

As shown in FIG. 4, the first frame 11a1 includes the first portion f1 arranged near the second end portion 11n in the longitudinal direction on which the connector 11c is arranged, and a second portion f2 arranged near the first end portion 11m in the longitudinal direction on which the connector 11c is not arranged. The transmittance of the light generated based on the plurality of the light-emitting elements 11g in the second portion f2 is lower than that in the first portion f1. Thus, the transmittance of the light generated based on the plurality of the light-emitting elements 11g in the first portion f1 is higher than that in the second portion f2. The light generated based on the plurality of the light-emitting elements 11g includes the light emitted from the light-emitting element 11g and the light whose wavelength has been converted by a phosphor, as below described. The first and second portions f1 and f2 form part of the continuum.

The first portion f1 has a concave shape bent toward the inside of the first frame 11a1. The second portion f2 has a pair of straight portions arranged so as to face to each other at an interval in the width direction of the first frame 11a1, and a bend portion having a concave shape bent toward the inside of the first frame 11a1 and connected with the end portions near the first end portion 11m of the pair of the straight portions. The first portion f1 connects the end portions near the second end portion 11n in the pair of the straight portions of the second portion f2.

The light emitted from the light-emitting elements 11g and the light whose wavelength is converted by the phosphor toward the first portion f1 of the first frame 11a1 transmit the first frame 11a1. On the other hand, the light emitted from the light-emitting elements 11g and the light whose wavelength is converted by the phosphor toward the second portion f2 of the first frame 11a1 reflect from the inner side of the first frame 11a1, i.e., reflect on the surface near the light-emitting elements 11g and emitted in the upward direction of the linear light-emitter 11.

In the linear light-emitter 11 of the present embodiment, the first light-emitting area 11/1 emitting light includes the surfaces of the seal 11b and first portion f1.

The above explanations of the first and second portions f1 and f2 of the first frame 11a1 may be applied appropriately to those of the first and second portions f1 and f2 of the second frame 11a2. For example, the second light-emitting area 11/2 includes the surfaces of the seal 11b and first portion f1. The second frame 11a2 includes the first portion f1 arranged near the first end portion 11m in the longitudinal direction on which the connector 11 is arranged, and the second portion f2 arranged near the second end portion 11n in the longitudinal direction on which the connector 11c is not arranged. The first portion f1 of the second light-emitting area 11/2 is referred to as a third portion, and the second portion f2 of the second light-emitting area 11/2 is referred to as a fourth portion. In the second light-emitting area 11/2, the transmittance of the light generated based on the plurality of the light-emitting elements 11g in the first portion f1 is higher than that in the second portion f2.

As shown in FIG. 8, part of the light emitted from the first light-emitting area 11/1 transmits the first portion f1, and the projecting portion d3 of the light guide plate 12 is irradiated with the light. Further, the facing first flat portion d1 of the light guide plate 12 is irradiated with the light emitted from the first light-emitting area 11/1 surrounded by the second portion f2.

Further, part of the light emitted from the second light-emitting area 11/2 transmits the first portion f1, and the projecting portion d3 of the light guide plate 12 is irradiated with the light. Further, the facing second flat portion d2 of the light guide plate 12 is irradiated with the light emitted from the second light-emitting area 11/2 surrounded by the second portion f2.

In the linear light-emitter 11, the difference between the light amount of light incident on the center in the longitudinal direction on the incidence surface 12b and the light amounts of lights incident on both ends in the longitudinal direction on the incidence surface 12b is small, and therefore the uniformity of the planar light emitted from the emission surface 12d of the light guide plate 12 may be improved.

The transmittance of the light generated based on the plurality of the light-emitting elements 11g in the first portion f1 is preferably 50 to 100%, and more preferably 75 to 100%.

The transmittance of the light generated based on the plurality of the light-emitting elements 11g in the second portion f2 is preferably 0 to 50%, and more preferably 0 to 25%.

The reflectivity of the light generated based on the plurality of the light-emitting elements 11g in the first portion f1 is preferably 0 to 50%, and more preferably 0 to 25%.

The reflectivity of the light generated based on the plurality of the light-emitting elements 11g in the second portion f2 is preferably 50 to 100%, and more preferably 75 to 100%.

The first portion f1 is made of, for example, a resin, such as a silicon resin or an epoxy resin. Further, the width of the first portion may be 1 mm, and the height of the first portion f1 may be 0.5 mm.

It is preferable that the second portion f2 is formed by a white resin. The second portion f2 is made of, for example, a resin, such as a silicon resin or an epoxy resin, in which fine particles of titanium oxide and etc., are dispersed. Further, the width of the second portion f2 may be 1 mm, and the height of the second portion f2 may be 0.5 mm.

The first seal 11b1 is arranged on the mount substrate 11j inside the first frame 11a1 for sealing the plurality of the light-emitting elements 11g forming the first light-emitting element line 11p1. The first seal 11b1 is a member including a phosphor in a resin having translucency to the light generated based on the plurality of the light-emitting elements 11g. The light generated based on the plurality of the light-emitting elements 11g includes the light emitted from the linear light-emitter 11g and the light whose wavelength is converted by the phosphor. The phosphor is a fluorescent material in the form of a particle, for example, such as YAG (yttrium aluminum garnet), which absorbs blue light emitted from the light-emitting elements 11g and converts the wavelength of the blue light into that of yellow light. White light is obtained by the blue light and the yellow light whose wavelength has been converted by the phosphor being mixed. The first seal 11b1 may be, for example, including a phosphor in a resin, such as an epoxy resin or a silicon resin. The first seal 11b1 may have a phosphor that absorbs blue light and converts the wavelength of the blue light into that of light of another color (red, green and etc.,). Further, the first seal 11b1 may have no phosphors.

As shown in FIG. 5, when the height of the surface of the mount substrate 11j is taken as a reference, the height (the position of the vertex) of the first frame 11a1 is higher than that of the position of the surface of the first seal 11b1. For example, the height of the first frame 11a1 may be higher than that of the position of the surface of the first seal 11b1 by 0.1 mm.

The above explanations of the first seal 11b1 may be applied appropriately to those of the second seal 11b2. For example, when the height of the surface of the mount substrate 11j is taken as a reference, the height (the position of the vertex) of the second seal 11b2 is higher than that of the position of the surface of the second seal 11b2.

The reflection sheet 14 reflects the light emitted from the reflection surface 12a of the light guide plate 12 toward the reflection surface 12a. For example, a metal plate, a film, and a foil having a light reflecting function, a film on which a silver-evaporated film is formed, a film on which an aluminum-evaporated film is formed, and a white sheet and etc., may be used as the reflection sheet 14.

The thickness of the reflection sheet 14 may be, for example, about 0.2 mm.

The diffusion sheet 16 diffuses and transmits the light emitted from the emission surface 12d of the light guide plate 12. The diffusion sheet 16 is formed by, for example, dispersing silica particles and etc., in a resin, such as a polycarbonate resin or an acryl resin.

The thickness of the diffusion sheet 16 may be, for example, about 0.1 mm.

The light-condensing sheet 17 adjusts the light distribution of the light incident from the diffusion sheet 16 and emits the light toward the reflection-type polarizing plate 18. The light-condensing sheet 17 has a fine light-condensing group on the surface facing to the reflection-type polarizing plate 18. For example, a prism sheet may be used as the light-condensing sheet 17.

The thickness of the light-condensing sheet 17 may be, for example, about 0.2 mm.

The reflection-type polarizing plate 18 transmits one of the S component and the P component of the light incident from the light-condensing sheet 17 and reflects another. The reflected component propagates toward the reflection sheet 14 and converted into the component that transmits the reflection-type polarizing plate 18 until the light is incident on the reflection-type polarizing plate 18 again. The reflection-type polarizing plate 18 has, for example, a multilayer structure formed by a resin.

The thickness of the reflection-type polarizing plate 18 may be, for example, about 0.4 mm.

The sheets arranged on the light guide plate 12 are not limited to the above embodiment. For example, when the planar light-emitting device 10 is used as a light source of a general illumination device, a first diffusion sheet and a second diffusion sheet may be arranged on the light guide plate 12. Further, when the planar light-emitting device 10 is used as a light source of a large-size display device, a first diffusion sheet, a second diffusion sheet, and a light-condensing sheet may be arranged on the light guide plate 12. Further, when the planar light-emitting device 10 is used as a light source of a large-size, a medium-size, or a small-size display device, a diffusion sheet and a light-condensing sheet may be arranged on the light guide plate 12. Further, when the planar light-emitting device 10 is used as a light source of a small-size display device, a diffusion sheet, a first light-condensing sheet, and a second light-condensing sheet may be arranged on the light guide plate 12.

FIG. 3 is a plan diagram showing the lower case 13, the reflection sheet 14 arranged within the lower case 13, the light guide plate 12, an adhesive material 10b, the linear light-emitter 11, and the spacer 15.

As shown in FIG. 3, the linear light-emitter 11 is fixed on the side 13b of the lower case 13 via the adhesive material 10b while the longitudinal direction of the linear light-emitter 11 is matched with that of the lower case 13. It is preferable that the adhesive material 10b has a high thermal conductivity. It is not necessary for the adhesive material 10b to be arranged entirely in the longitudinal direction of the linear light-emitter 11. Thermally conductive greases may be arranged between the linear light-emitter 11 on which the adhesive material 10b is not arranged and the side 13b. Further, the adhesion strength between the mount substrate 11j and the adhesive material 10b is improved by forming convexo-concave structures on the back surface of the mount substrate 11j in the linear light-emitter 11. The convexo-concave structures on the back surface of the mount substrate 11j are formed by, for example, mechanical processing, such as sandblast, chemical processing, such as etching, or physical processing, such as plasma.

The light guide plate 12 is stored in the space 13f of the lower case 13 so that the incidence surface 12b thereof faces to the first and second light-emitting areas 11l1 and 11l2 of the linear light-emitter 11 (see FIG. 7B). Further, the light guide plate 12 is arranged in the space 13f of the lower case 13 so that the pair of the protruding portions 12e is contact with the first and second end portions 11m and 11n in the longitudinal direction of the linear light-emitter 11.

Elastic spacers 15 are arranged between both end portions in the longitudinal direction on the opposite surface 12c of the light guide plate 12 and the side 13c of the lower case 13. Both end portions in the longitudinal direction of the light guide plate 12 are pressed on the opposite surface 12c toward the linear light-emitter 11 by the spacers 15. The pair of the protruding portions 12e in the light guide plate 12 presses the first and second end portions 11m and 11n in the longitudinal direction of the linear light-emitter 11, and therefore the light guide plate 12 is fixed within the space 13f of the lower case 13.

Further, as shown in FIG. 4, in the linear light-emitter 11, a center axis L1 passing through the center in the width direction perpendicular to the longitudinal direction in the mount substrate 11j and a center axis L2 passing through the center in the width direction perpendicular to the longitudinal direction in the first and second frames 11a1 and 11a2 do not match with each other. The first and second frames body 11a1 and 11a2 are formed substantially line-symmetrically with respect to the center axis L2. Thus, a distance S1 between the first and second frames 11a1 and 11a2 and an end edge in the positive direction of the Y-axis on the mount substrate 11j is longer than a distance S2 between the first and second frames 11a1 and 11a2 and an end edge in the negative direction of the Y-axis on the mount substrate 11j.

As shown in FIG. 7B, since the light axis of the light-emitting area 11l of the linear light-emitter 11 and the light axis of the incidence surface 12b of the light guide plate 12 match with each other, the light emitted from the linear light-emitter 11 is incident on the incidence surface 12b of the light guide plate 12 efficiently.

Within the storage case 10a, only the reflection sheet 14 is arranged under the reflection surface 12a of the light guide plate 12, and the diffusion sheet 16, the light-condensing sheet 17, and the reflection-type polarizing plate 18 are arranged on the emission surface 12d of the light guide 12. Since the thicknesses of the sheet arranged under the light guide plate 12 and that of the sheets arranged thereon are different, and the distance S1 is longer than the distance S2 in the linear light-emitter 11, the light axis of the light-emitting area 11l of the linear light-emitter 11 and the light axis of the incidence surface 12b of the light guide plate 12 substantially match with each other.

Next, the operation of the above explained planar light-emitting device 10 of the present embodiment is explained.

The light-emitting element 11g of the linear light-emitter 11 emits light when external power is supplied to the connector 11c. The linear light emitted from the linear light-emitter 11 is incident on the incidence surface 12b of the light guide plate 12 from the light-emitting area 11l as shown in FIG. 7B.

Most of the light emitted from the surfaces of the first and second seals 11b1 and 11b2 of the linear light-emitter 11 propagates toward the incidence surface 12b of the light guide plate 12. Further, a part of the light emitted from the surfaces of the first and second seals 11b1 and 11b2 of the linear light-emitter 11 propagates toward the first and second frames 11a1 and 11a2. The light propagating toward the first and second frames 11a1 and 11a2 reflects from the surfaces of the first and second frames 11a1 and 11a2 and propagates toward the incidence surface 12b of the light guide plate 12. The light propagating toward the first and second frames 11a1 and 11a2 is guided so as to propagate toward the incidence surface 12b of the light guide plate 12. The relationship between the position of the surfaces of the first and second seals 11b1 and 11b2 and the heights of the first and second frames 11a1 and 11a2 may be appropriately designed based on the dimensions of the linear light-emitter 11 and the positional relationship between the linear light-emitter 11 and the light guide plate 12. Further, in the planar light-emitting device 10, when the heights of the first and second frames 11a1 and 11a2 is increased and the distance between the first and second frames 11a1 and 11a2 and the incidence surface 12b of the light guide plate 12 is reduced, the light emitted from the linear light-emitter 11 may be incident on the incidence surface 12b efficiently.

The light incident on the incidence surface 12b of the light guide plate 12 is gradually emitted from the emission surface 12d toward the diffusion sheet 16 while propagating in the light guide plate 12 toward the opposite surface 12c. Further, a part of the light reflects from the reflection sheet 14 and is emitted from the emission surface 12d toward the diffusion sheet 16. The linear light emitted from the linear light-emitter 11 is converted into planar light emitted from the emission surface 12d of the light guide plate 12.

The planar light emitted from the emission surface 12d of the light guide 12 is incident on the diffusion sheet 16, the light-condensing sheet 17, and the reflection-type polarizing plate 18 and is emitted to the outside of the planar light-emitting device 10.

According to the above planar light-emitting device of the present embodiment, the linear light-emitter arranges a plurality of light-emitting elements in a high density, and therefore the linear light-emitter may emit planar light having high luminance and uniform light intensity.

Next, modifications 1 to 9f the above linear light-emitter in the planar light-emitting device of the present embodiment are explained with reference to FIG. 9 to FIG. 22. In a modification of the linear light-emitter, for example, the light-emission intensity of a first area in the first light-emitting area apart from the second light-emitting area is lower than that of a second area in the first light-emitting area closer to the second light-emitting area. Further, the light-emission intensity of a third area in the second light-emitting area close to the first light-emitting area is higher than that of a fourth area in the second light-emitting area apart from the first light-emitting area.

Figure 9:
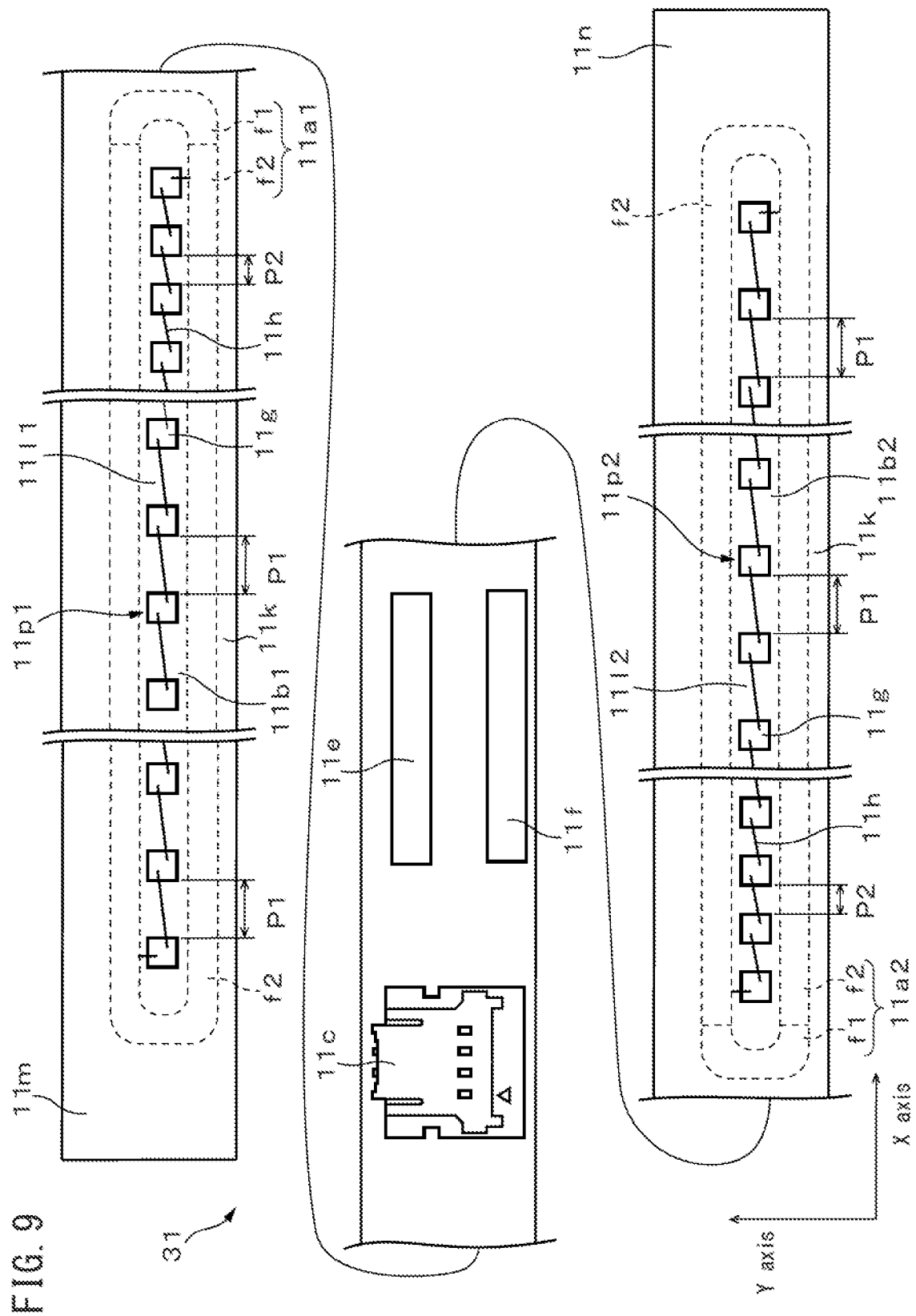
FIG. 9 is an enlarged plan diagram of the modification 1 of the linear light-emitter of one embodiment of the planar light-emitting device disclosed in the present specification.

FIG. 9 is an enlarged plan diagram of the modification 1 of the linear light-emitter of one embodiment of the planar light-emitting device disclosed in the present specification.

In a linear light-emitter 31 of the present modification, the plurality of the light-emitting elements 11g forms the first light-emitting element line 11p1 and the second light-emitting element line 11p2 arranged side by side in the longitudinal direction of the linear light-emitter 31 similar to the above embodiment. The explanations for the first light-emitting element line 11p1 may be applied appropriately to those of the second light-emitting element line 11p2.

In the first light-emitting element line 11p1, an interval P2 between the adjacent light-emitting elements 11g near the second end portion 11n arranged close to the connector 11c is narrower than an interval P1 between the adjacent light-emitting elements 11g near the first end portion 11m apart from the connector. In FIG. 9, the plurality of the light-emitting elements 11g is indicated by a solid line for easy to see, and on the other hand, the first and second frames 11a1 and 11a2 are indicated by a broken line.

Figure 10:
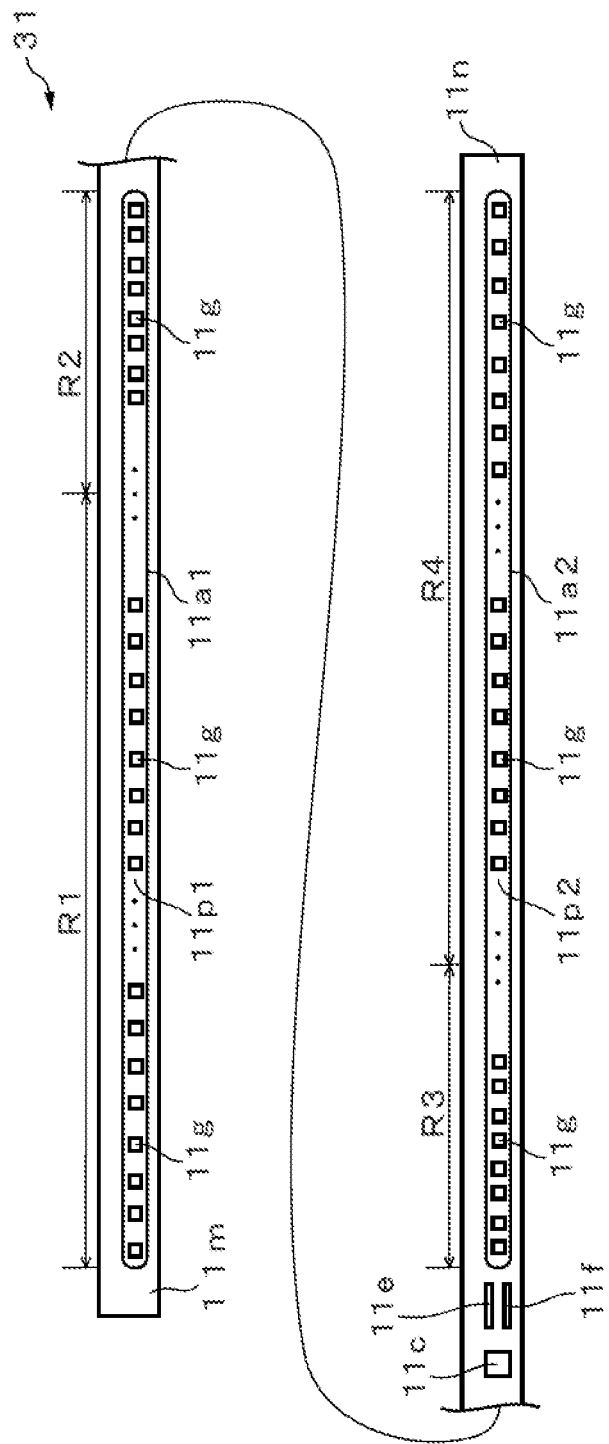
FIG. 10 is an explanation diagram for the modification 1 shown in FIG. 9.

As shown in FIG. 10, in the longitudinal direction of the linear light-emitter 31, the first light-emitting element line 11p1 is divided into a first area R1 and a second area R2 from the first end portion 11m toward the second end portion 11n. Eight rows are formed in the first area R1 and the eight light-emitting elements 11g in each row of the eight lines are arranged at the intervals P1, and four rows are formed in the second area R2 and the eight light-emitting elements 11g in each row of the four rows are arranged at the intervals P2. In the first light-emitting element line 11p1, a first interval between the light-emitting elements 11g arranged in the first area Rh is wider than a second interval between the light-emitting elements 11g arranged in the second area R2.

Similarly, the second light-emitting element line 11p2 is divided into a third area R3 and a fourth area R4 from the first end portion 11m toward the second end portion 11n. Four rows are formed in the third area R3 and the eight light-emitting elements 11g in each group of the four rows arranged at the intervals P2, and eight rows are formed in the fourth area R4 and the eight light-emitting elements 11g in each row of the eight rows are arranged at the intervals P1. In the second light-emitting element line 11p2, the first interval between the light-emitting elements 11g arranged in the third area R3 is narrower than the second interval between the light-emitting elements 11g arranged in the fourth area R4.

The density per unit length (referred to as line density) in the X-axis direction of the plurality of the light-emitting elements 11g in the second area R2 of the first light-emitting element line 11p1 is higher than that in the first area R1 of the first light-emitting element line 11p1. The light-emission intensity in the first area R1 of the first light-emitting element line 11p1 is lower than that in the second area R2 of the first light-emitting element line 11p1.

Similarly, the density per unit length (referred to as line density) in the X-axis direction of the plurality of the light-emitting elements 11g in the third area R3 of the second light-emitting element line 11p2 is higher than that in the fourth area R4 of the second light-emitting element line 11p2. The light-emission intensity in the first area R1 of the first light-emitting element line 11p1 is higher than that in the second area R2 of the second light-emitting element line 11p2.

Thus, the light-emission intensity of the linear light-emitter 31 is high in the second and third areas R2 and R3 of the linear light-emitter 31, and is low in the first and fourth areas R1 and R4.

In the linear light-emitter 31 of the present modification, the line density of the plurality of the light-emitting elements 11g in the second area R2 of the first light-emitting element line 11p1 and the third area R3 of the second light-emitting element line 11p2 is higher than the line density of the plurality of the light-emitting elements 11g in the first area R1 and the fourth area R4. Since the line density of the light-emitting elements 11g in the second and third areas R2 and R3 is higher than that in the first and fourth areas R1 and R4, the difference between the amount of light incident in the center in the longitudinal direction on the incidence surface 12b and the amount of light incident in both sides in the longitudinal direction on the incidence surface 12b is small. Since the difference between the amount of light incident in the center on the incidence surface 12b and the amount of light incident in both sides on the incidence surface 12b is small, the uniformity of the planar light emitted from the emission surface 12d of the light guide plate 12 may be further improved. In the linear light-emitter 31 of the present modification, all of the first and second frames 11a1 and 11a2 may be formed by the second portion f2. Further, the intervals between the light-emitting elements 11g in the portion other than the end portions near the connector 11c in the longitudinal direction of the first light-emitting element line 11p1 may be different. Similarly, the intervals between the light-emitting elements 11g in the portion other than the end portions near the connector 11c in the longitudinal direction of the second light-emitting element line 11p2 may be different. The plurality of the light-emitting elements 11g included in the first and second light-emitting element lines 11p1 and 11p2 form rows arranged side by side in a predetermined direction and the intervals between the light-emitting elements 11g may be different in the rows arranged side by side in the predetermined direction, at least partially.

Further, the uniformity of the planar light emitted from the emission surface 12d of the light guide plate 12 may be improved by arranging the reflection sheets on the sides on both end parts in the longitudinal direction of the light guide plate 12. The other configurations are the same as those of the embodiment described above.

Figure 11:
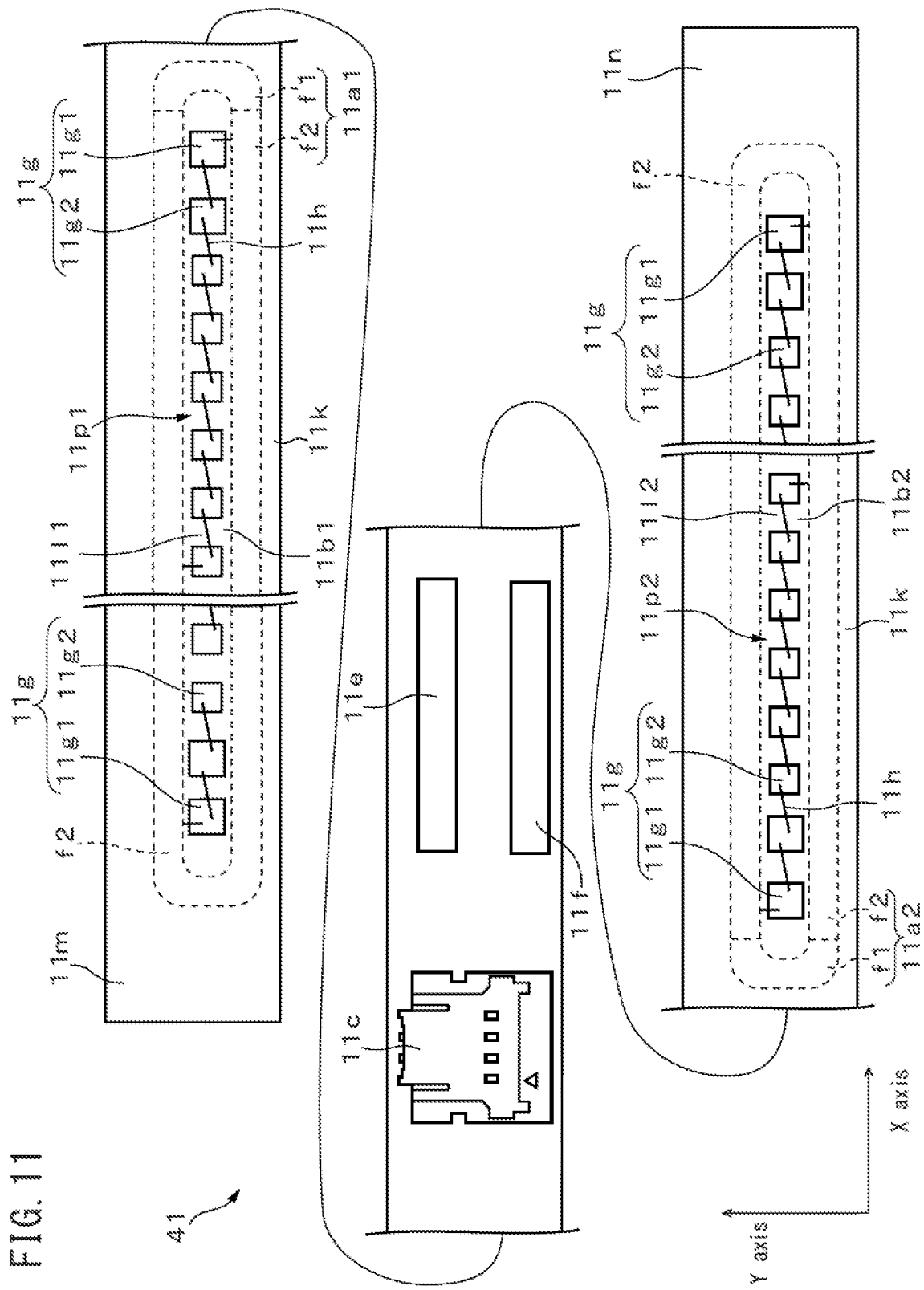
FIG. 11 is an enlarged plan diagram of the modification 2 of the linear light-emitter of one embodiment of the planar light-emitting device disclosed in the present specification.

FIG. 11 is an enlarged plan diagram of the modification 2 of the linear light-emitter of one embodiment of the planar light-emitting device disclosed in the present specification.

In a linear light-emitter 41 of the present modification, the plurality of the light-emitting elements 11g forms the first light-emitting element line 11p1 and the second light-emitting element line 11p2 arranged side by side in the longitudinal direction of the linear light-emitter 41, similar to the above embodiment. The explanations for the first light-emitting element line 11p1 may be applied appropriately to those of the second light-emitting element line 11p2.

In the first light-emitting element line 11p1, the intensity of the light emitted from a light-emitting element 11g1 arranged near the second end portion 11n is higher than that of the light emitted from a light-emitting element 11g2 arranged on near the first end portion 11m.

The light-emitting elements 11g1 are arranged, for example, in the second area R2 of the above modification 1. Further, the light-emitting elements 11g2 are arranged in the first area R1 of the above modification 1. In the example shown in FIG. 11, two light-emitting elements 11g1 are arranged on the end portions near the second end portions 11n in the longitudinal direction of the first light-emitting element line 11p1, and light-emitting elements 11g2 are arranged at the position other than the second end portions lin.

Preferably, the intensity of the light emitted from the light-emitting element 11g1 is higher than that of the light emitted from the light-emitting element 11g2 by 5% or more, and more preferably, is further higher by 10% or more.

The other configurations of the linear light-emitter 41 of the present modification are the same as those of the above embodiment.

According to the linear light-emitter 41 of the present modification, the uniformity of the planar light emitted from the emission surface 12d of the light guide plate 12 may be improved. In the linear light-emitter 41 of the present modification, all of the first and second frames 11a1 and 11a2 may be formed by the second portion f2.

Figure 12:
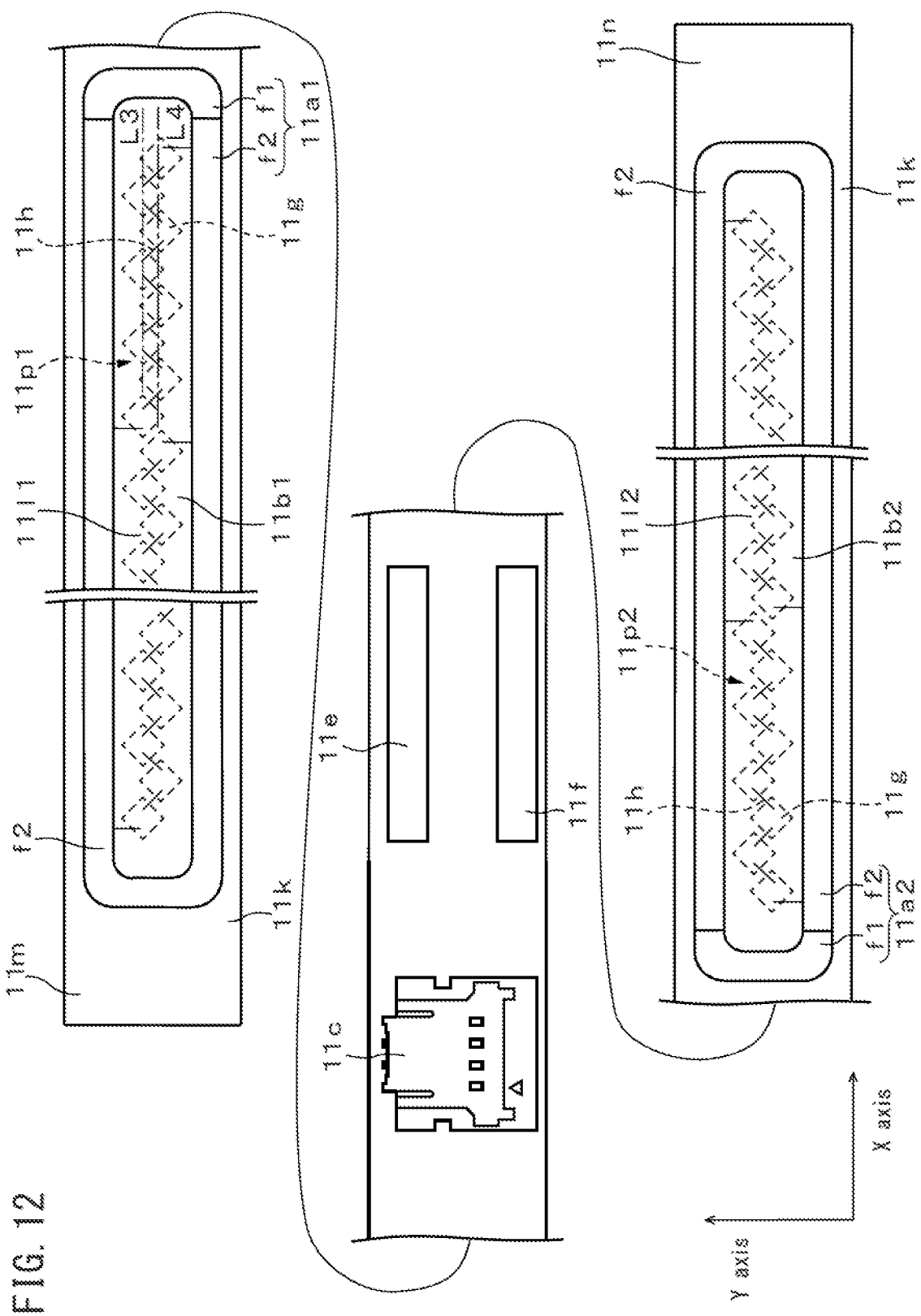
FIG. 12 is an enlarged plan diagram of the modification 3 of the linear light-emitter of one embodiment of the planar light-emitting device disclosed in the present specification.

FIG. 12 is an enlarged plan diagram of the modification 3 of the linear light-emitter of one embodiment of the planar light-emitting device disclosed in the present specification.

In a linear light-emitter 51 of the present modification, the plurality of the light-emitting elements 11g forms the first light-emitting element line 11p1 and the second light-emitting element line 11p2 arranged side by side in the longitudinal direction of the linear light-emitter 51 similar to the above embodiment. The explanations for the first light-emitting element line 11p1 may be applied appropriately to those of the second light-emitting element line 11p2.

Figure 13:
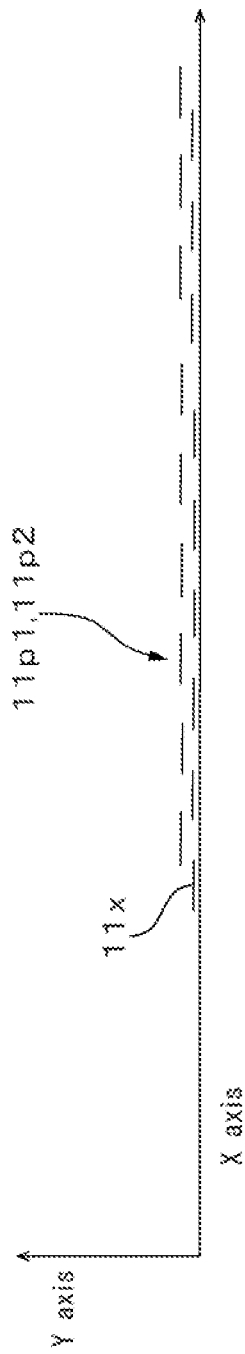
FIG. 13 is an explanation diagram for the modification 1 shown in FIG. 12.

In the first light-emitting element line 11p1, when the area on which the plurality of the light-emitting elements 11g is arranged are projected in the X-axis direction, as shown in FIG. 13, projected components 11x of the adjacent light-emitting elements 11g overlap. On the other hand, in the above embodiment, when the areas one which the plurality of the light-emitting elements 11g is arranged are projected in the X-axis direction, the projected components of the adjacent light-emitting elements 11g do not overlap.

Specifically, as shown in FIG. 12, the light-emitting elements 11g are linearly arranged along the X-axis direction while the positions thereof are shifted alternately in the positive and negative directions of the Y-axis. A first row in which each light-emitting elements 11g are arranged so that pairs of corners facing to each other are arranged side by side on a straight line L3 extending in the X-axis direction, and a second row in which each light-emitting elements 11g are arranged so that pairs of corners facing to each other are arranged side by side on a straight line L4 extending in the X-axis direction are formed. The other configurations are the same as those of the embodiment described above.

In the present modification, the plurality of the light-emitting elements 11g are arranged on the mount substrate 11j in the line density further higher than that of the above embodiment. Further, in the above embodiment, the adjacent light-emitting elements 11g are arranged so that the sides thereof facing to each other, and therefore the light emitted from each of light-emitting elements 11g interferes and cancels each other. On the other hand, in the present modification, as shown in FIG. 12, since the positional relationship between the adjacent light-emitting elements 11g deviates from the positional relationship in which the sides are arranged so as to face to each other, the interference and cancelation of the light emitted from each of light-emitting elements 11g is suppressed.

Figure 14:
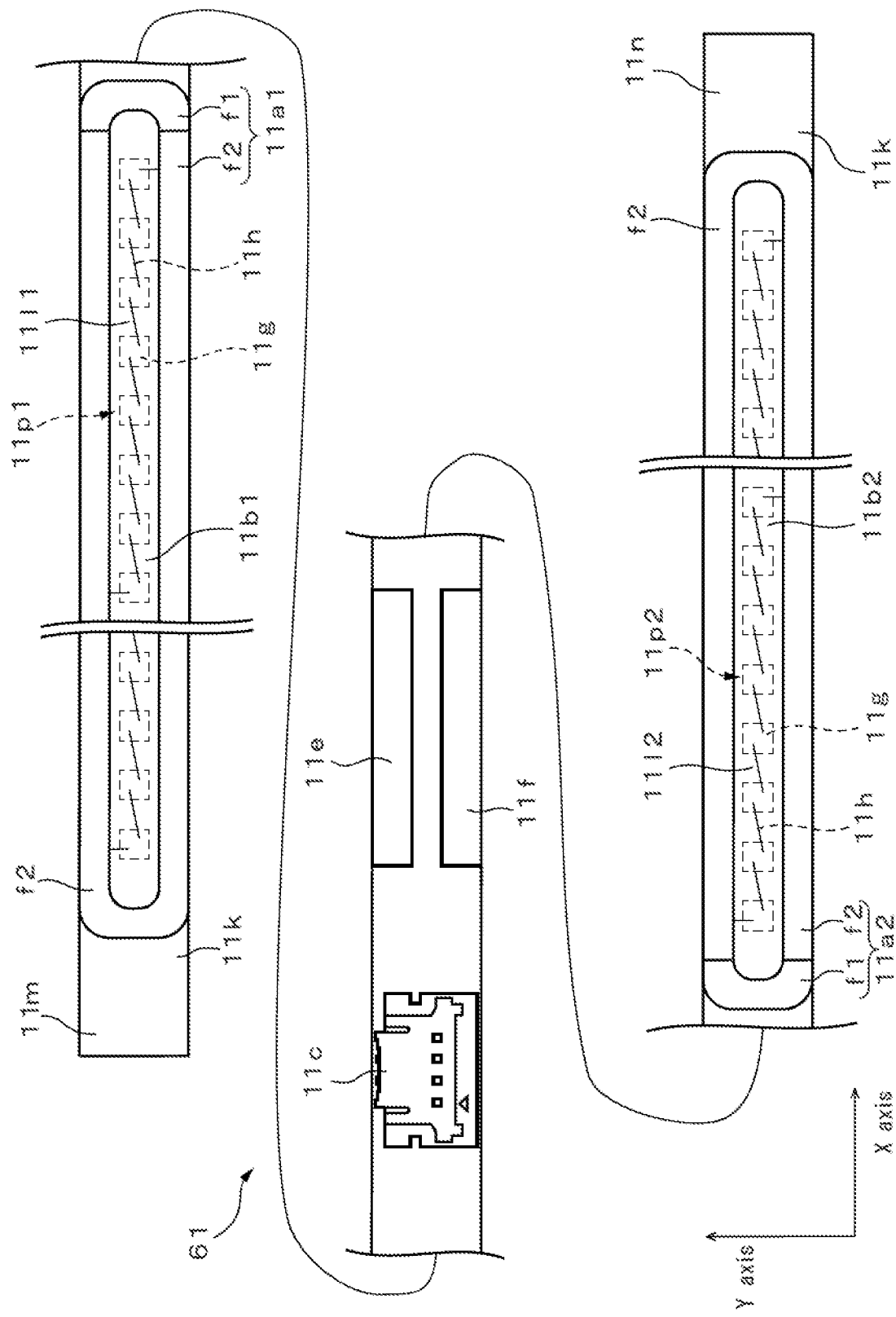
FIG. 14 is an enlarged plan diagram of the modification 4 of the linear light-emitter of one embodiment of the planar light-emitting device disclosed in the present specification.

FIG. 14 is an enlarged plan diagram of the modification 4 of the linear light-emitter of one embodiment of the planar light-emitting device disclosed in the present specification.

In a linear light-emitter 61 of the present modification, the portion of the mount substrate 11j and the circuit substrate 1li extending toward the outside from the first and second frames 11a1 and 11a2 in the Y-axis direction of the linear light-emitter 61 is removed. The other configurations are the same as those of the above embodiment.

Thus, the dimension in the Y-axis direction of the linear light-emitter 61 may be reduced. When the linear light-emitter 61 whose dimension in the Y-axis direction is small is used, the planar light-emitting device 10 having thicker thickness may be provided.

Figure 15:
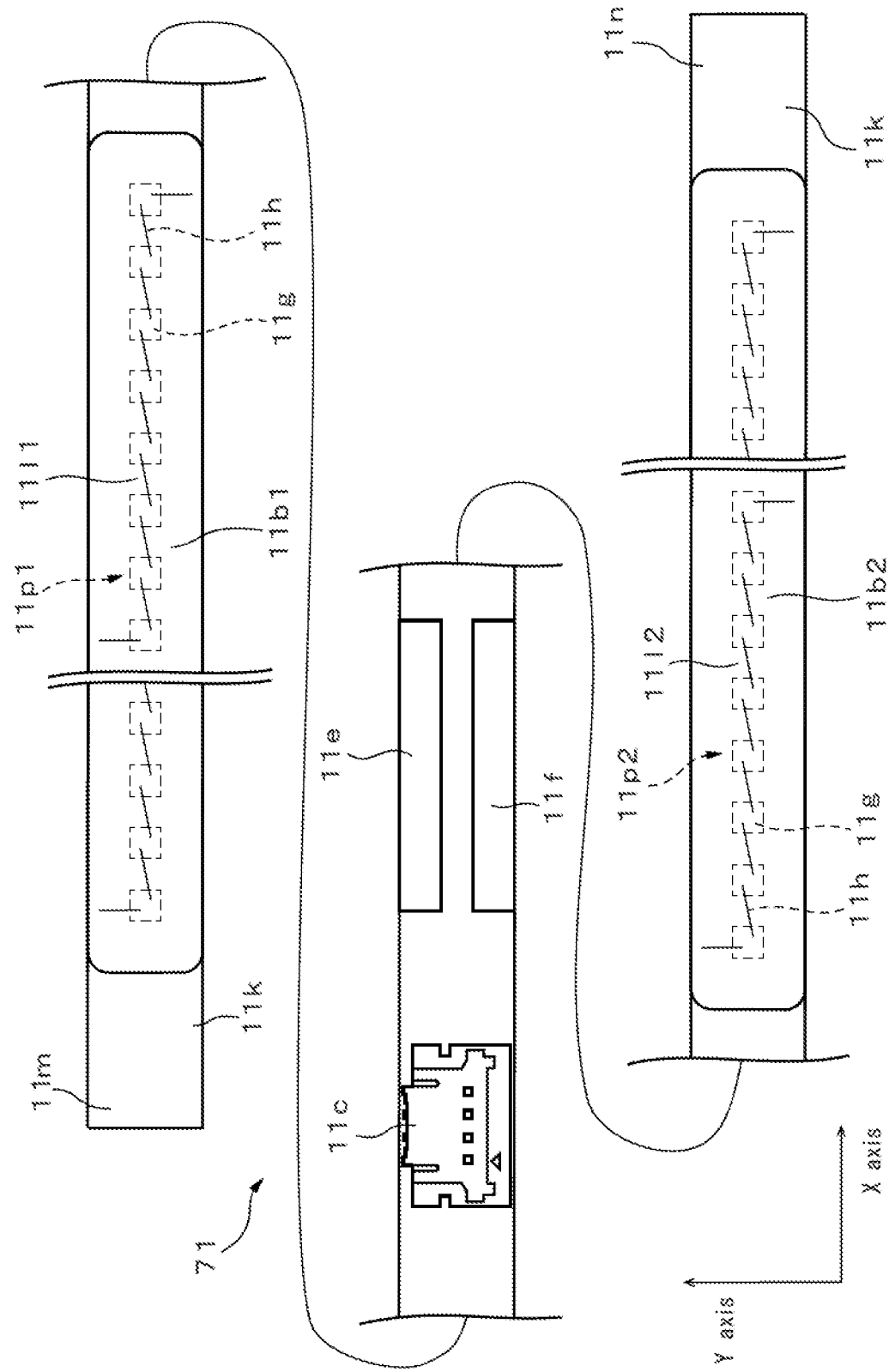
FIG. 15 is an enlarged plan diagram of the modification 5 of the linear light-emitter of one embodiment of the planar light-emitting device disclosed in the present specification.

FIG. 15 is an enlarged plan diagram of the modification 5 of the linear light-emitter of one embodiment of the planar light-emitting device disclosed in the present specification.

A linear light-emitter 71 of the present modification is different from that of the above modification 4 in that no frames are arranged. The surfaces of the first and second seals 11b1 and 11b2 form the first and second light-emitting areas 11/1 and 11/2 similar to those of the above embodiment. The other configurations are the same as those of the above modification 4.

For example, the first and second seals 11b1 and 11b2 of the present modification may be formed without using frames by forming the seals made of a material having a high thixotropy property. The fluidity of the material having the thixotropy property increases by applying stress, and the fluidity reduces by stopping to apply the stress. First, while the material of the first and second seals 11b1 and 11b2 are applying stress and the fluidity thereof is high, the material is poured onto the mount substrate 11j so that the plurality of the light-emitting elements 11g are embedded. Then, the material is hardened after reducing the fluidity by stopping to apply the stress, and therefore the first and second seals 11b1 and 11b2 are obtained. Further, the first and second seals 11b1 and 11b2 may be formed by using a material having a high viscosity in place of the material having a high thixotropy property.

Figure 16:
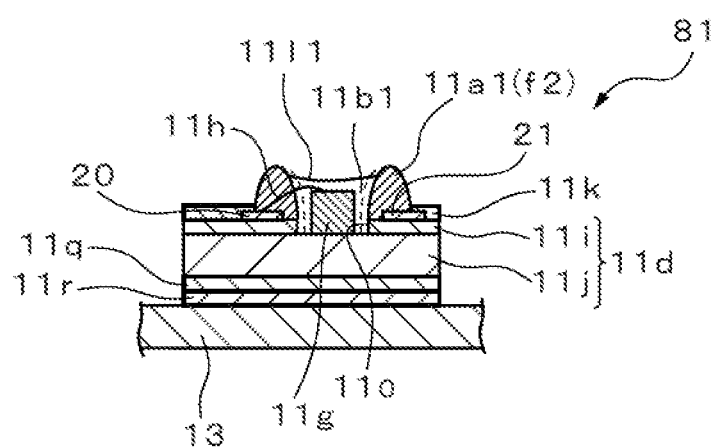
FIG. 16 is an enlarged plan diagram of the modification 6 of the linear light-emitter of one embodiment of the planar light-emitting device disclosed in the present specification.

FIG. 16 is an enlarged cross-sectional diagram of the modification 6 of the linear light-emitter of one embodiment of the planar light-emitting device disclosed in the present specification. FIG. 16 is an enlarged cross-sectional diagram corresponding to FIG. 5.

A linear light-emitter 81 of the present modification is different from that of the above embodiment in that the mount substrate 11j may join with the lower case 13.

A surface processing layer 11q for joining with the lower case 13 is formed on the surface on the lower case 13 of the mount substrate 11j. For example, when the mount substrate 11j is an aluminum substrate, a copper-plated layer may be formed as the surface processing layer 11q on the mount substrate 11j, by sputtering the surface of the aluminum substrate with copper ions. The method of forming the surface processing layer 11q is not limited to the method described above. For example, the surface processing layer 11q may be formed by joining a copper foil with the back surface of the mount substrate 11j. Further, as indicated by a broken line in FIG. 16, when the inside portion of the first frame 11a1 is arranged at a position deeper in the inward direction than the inside portion of the circuit substrate 11i, the first frame 11a1 may be formed so that the inside portion of the first frame 11a1 is arranged on the mount substrate 11j.

The surface processing layer 11q is joined with the lower case 13 via a joint layer 11r, such as solder.

The thermal conductivities of the surface processing layer 11q and the joint layer 11r are higher than that of an adhesive material formed by a resin. Thus, a more amount of heat generated by the light-emitting elements 11g is conducted to the lower case via the mount substrate 11j. Further, the joint strength between the linear light-emitter 71 and the lower case 13 may improve. The other configurations are the same as those of the above embodiment.

Figure 17:
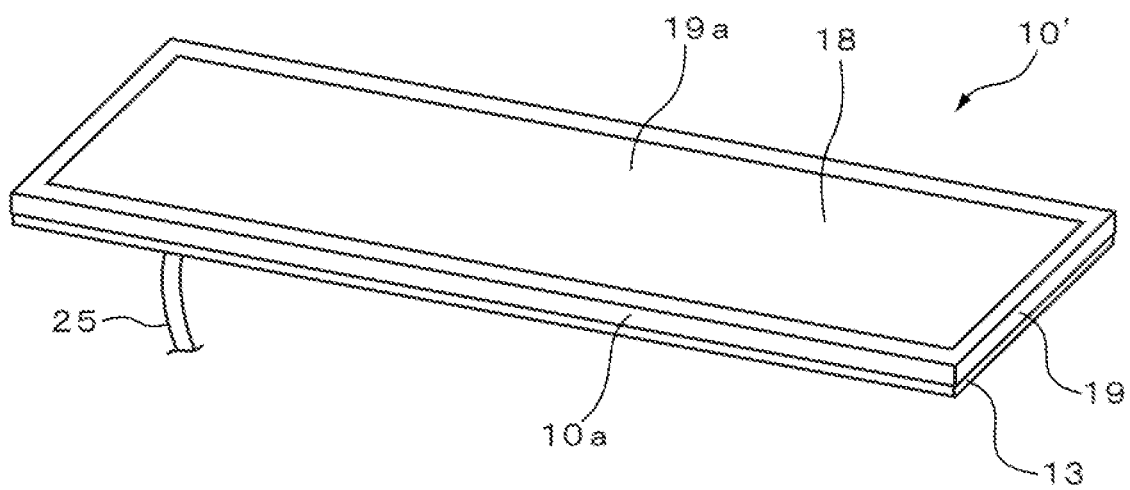
FIG. 17 is a perspective diagram of the modification of the planar light-emitting device disclosed in the present specification.
Figure 18:
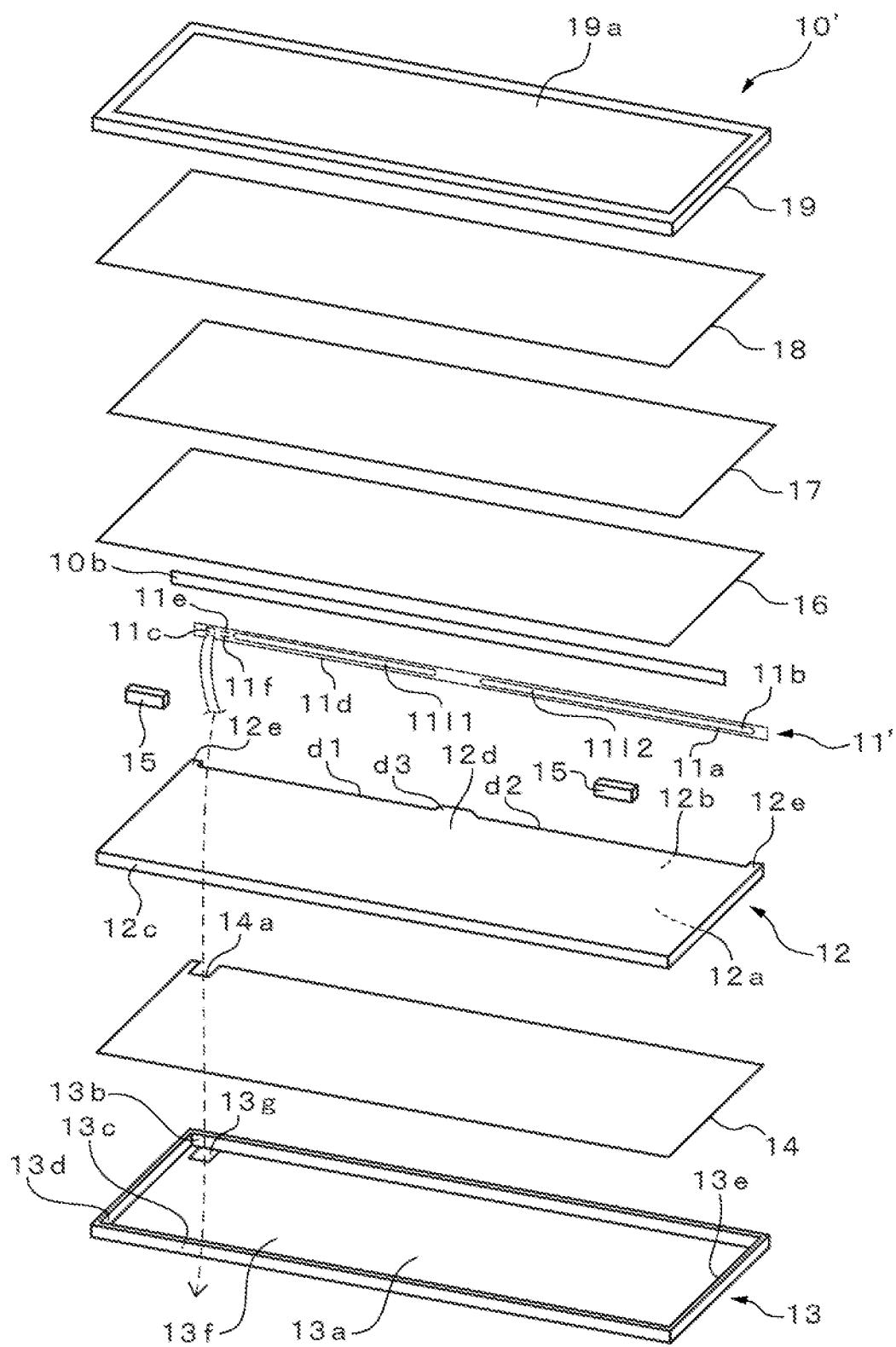
FIG. 18 is an exploded perspective diagram of the planar light-emitting device shown in FIG. 17.
Figure 19:
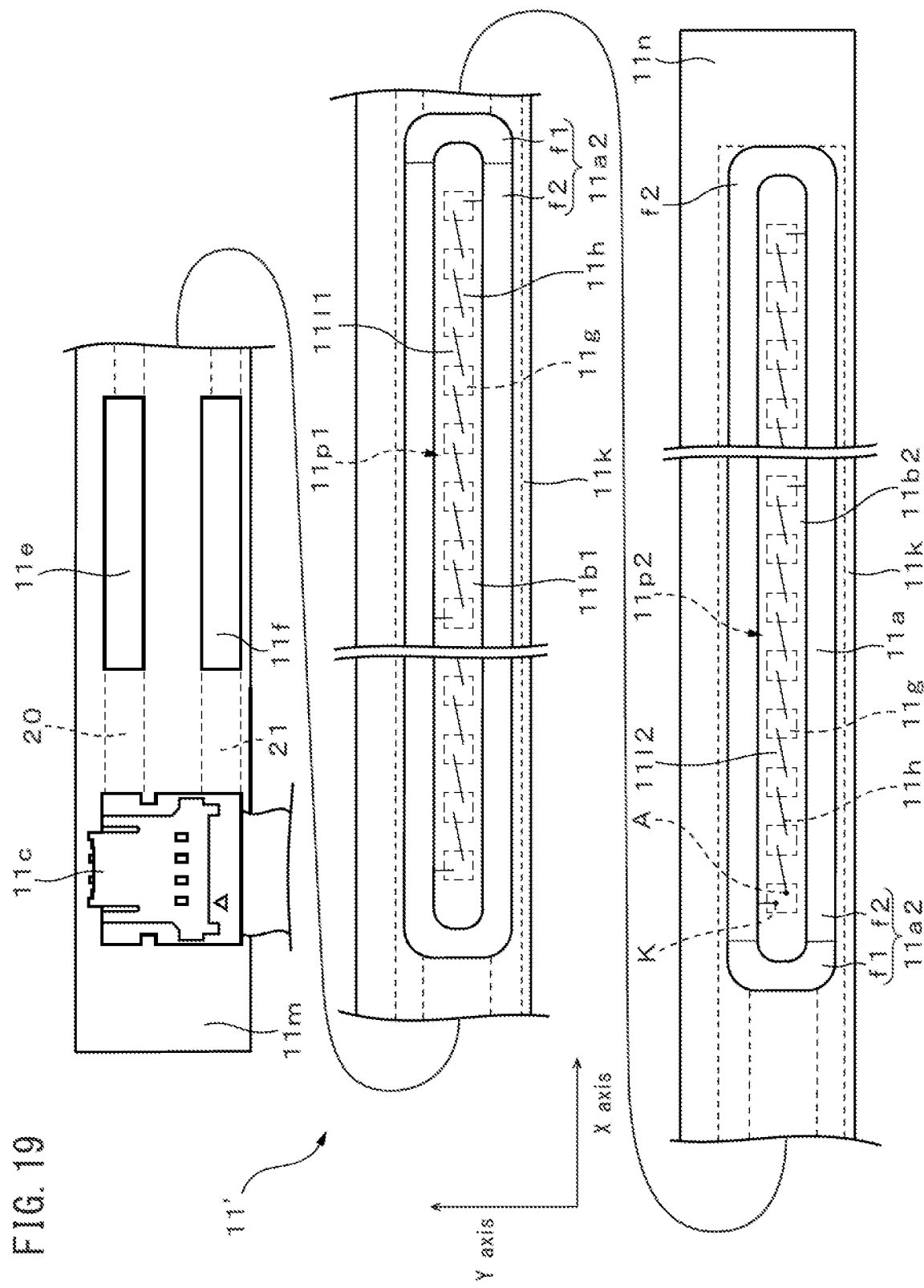
FIG. 19 is an enlarged cross-sectional diagram of the linear light-emitter shown in FIG. 18.
Figure 20:
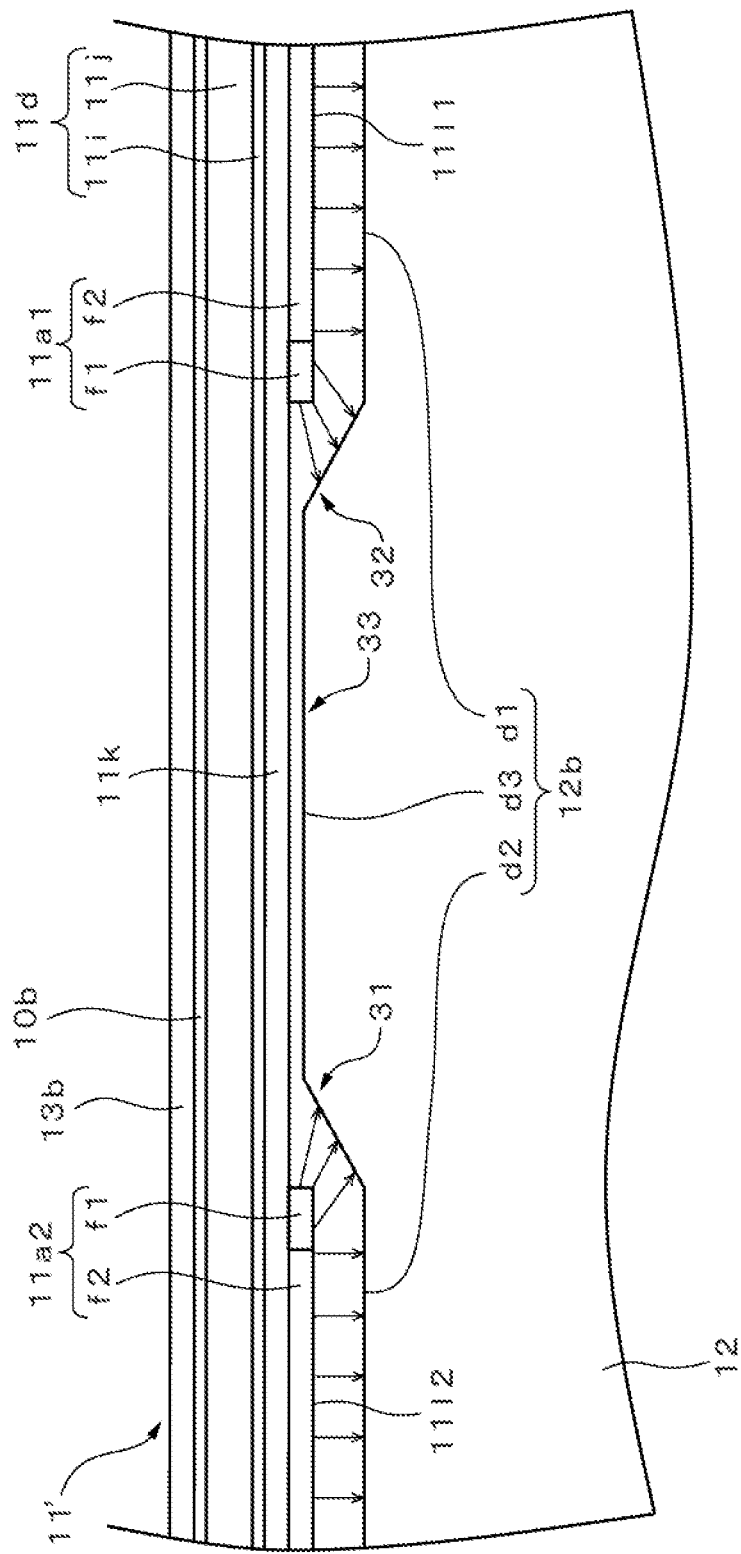
FIG. 20 is an enlarged plan diagram corresponding to FIG. 8.

FIG. 17 is a perspective diagram of the modification of the planar light-emitting device disclosed in the present specification, FIG. 18 is an exploded perspective diagram of the planar light-emitting device shown in FIG. 17, FIG. 19 is an enlarged cross-sectional diagram of the linear light-emitter shown in FIG. 18, and FIG. 20 is an enlarged plan diagram corresponding to FIG. 8.

A planar light-emitting device 10' according to the modification 7 differs from the planar light-emitting device 10 in that the planar light-emitting device 10' has a linear light-emitter 11' in place of the linear light-emitter 11. The configurations and functions of the components of the planar light-emitting device 10' other than the linear light-emitter 11' are the same as the those of the components of the planar light-emitting device 10, to which the same symbols are attached, and therefore detailed explanation thereof is omitted here.

The linear light-emitter 11' differs from the linear light-emitter 11 in the arrangement of the connector 11c and the inspection electrodes 11e and 11f. In the linear light-emitter 11, the connector 11c and the inspection electrodes 11e and 11f are arranged between the first light-emitting area 11/1 and the second light-emitting area 11/2. On the other hand, in the linear light-emitter 11', the connector 11c and the inspection electrodes 11e and 11f are arranged near the first end portion 11m.

In the planar light-emitting device 10', the projecting portion d3 is arranged so as to be close to the area between the first light-emitting area 11/1 and the second light-emitting area 11/2. In the planar light-emitting device 10', the pair of the protruding portions 12e is contacted with the first and second end portions 11m and 11n, and the projecting portion d3 is arranged so as to be close to the area between the first and second light-emitting area 11/1 and 11/2, and therefore the linear light-emitter 11' is prevented from bending due to heat generated thereby. The planar light-emitting device 10' may emit uniform light, since the linear light-emitter 11' is prevented from bending due to heat generated thereby, and the distances between the first and second light-emitting areas 11/1 and 11/2 and the incidence surface 12b are constant.

In the planar light-emitting device 10', the projecting portion d3 is arranged so as to be close to the area between the first and second light-emitting areas 11/1 and 11/2. However, in the planar light-emitting device according to the embodiment, the projecting portion d3 may be arranged so as to be contacted with the area between the first and second light-emitting areas 11/1 and 11/2.

Figure 21:
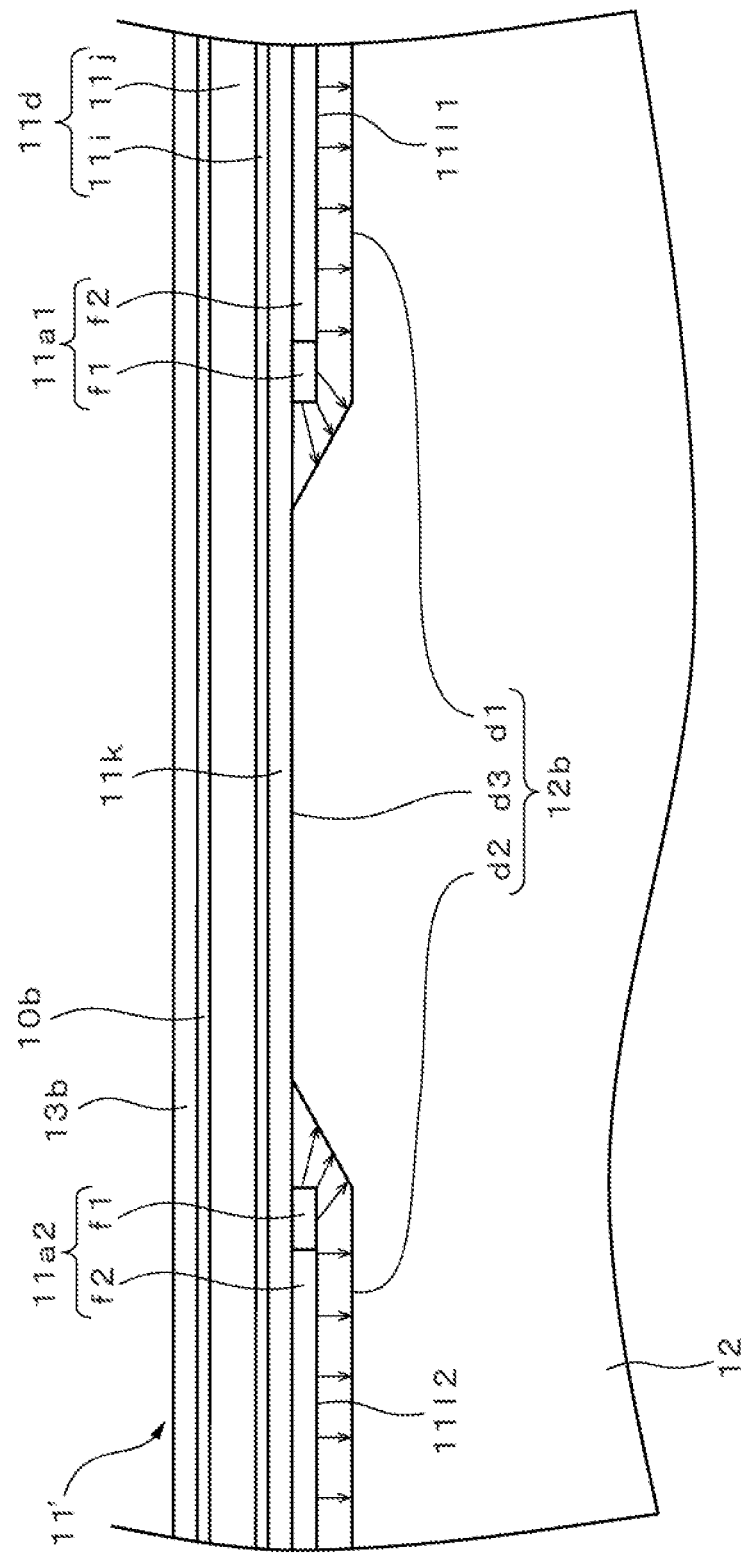
FIG. 21 is an enlarged plan diagram of a planar light-emitting device according to the modification 8, corresponding to FIG. 8.

FIG. 21 is an enlarged plan diagram of a planar light-emitting device according to the modification 8, corresponding to FIG. 8.

In the planar light-emitting device according to the modification 8, the projecting portion d3 is arranged so as to be contact with the area between the first and second light-emitting areas 11/1 and 11/2. In the planar light-emitting device according to the modification 8, since the projecting portion d3 is contact with the area between the first and second light-emitting areas 11/1 and 11/2, the linear light-emitter 11' is further prevented from bending due to heat generated thereby.

Figure 22:
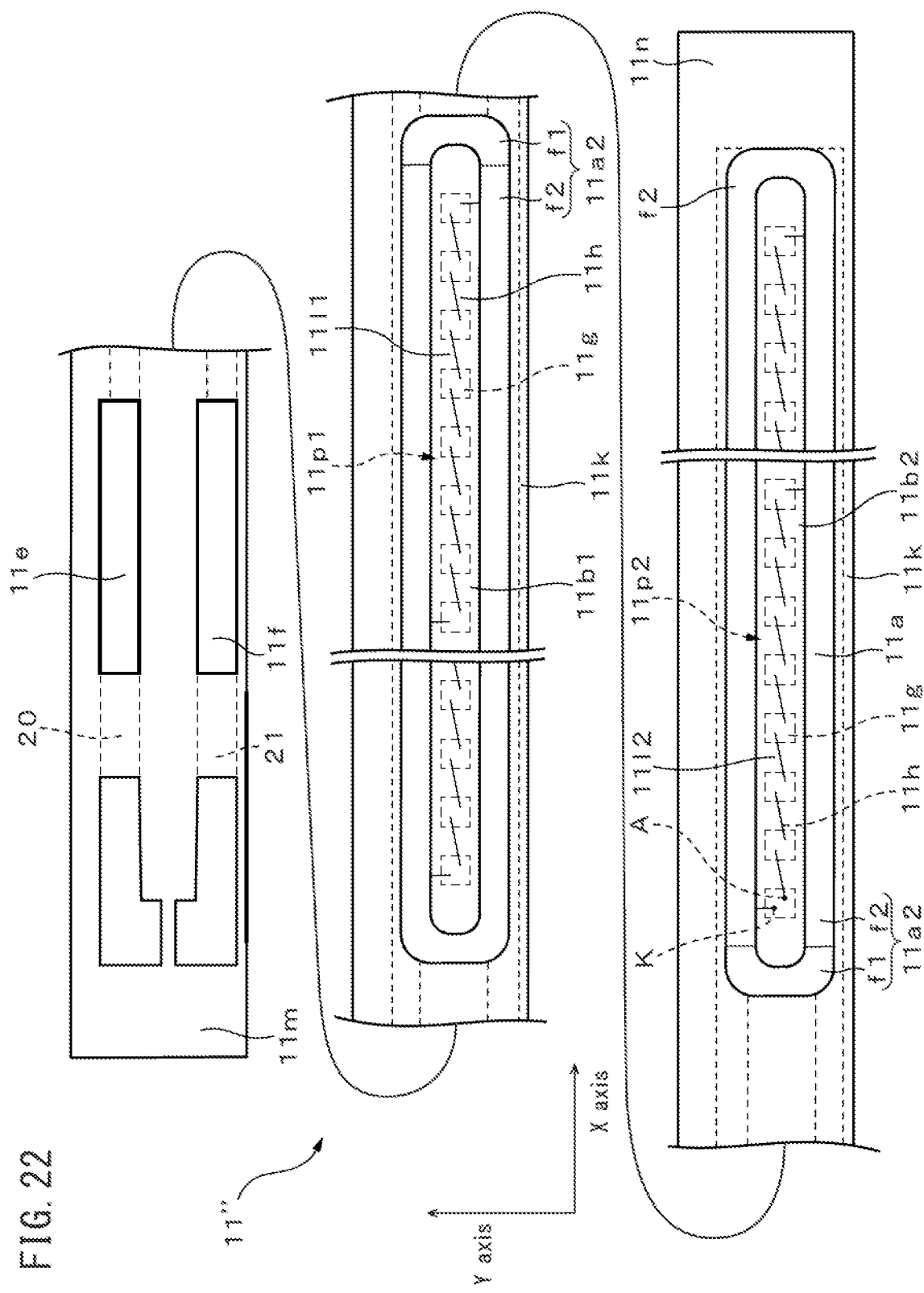
FIG. 22 is an enlarged plan diagram of the modification 9 of the linear light-emitter of one embodiment of the planar light-emitting device disclosed in the present specification.

FIG. 22 is an enlarged plan diagram of the modification 9 of the linear light-emitter of one embodiment of the planar light-emitting device disclosed in the present specification.

A linear light-emitter 11" differs from the linear light-emitter 11' in that the linear light-emitter 11" has a pair of connection pads 11s and 11t in place of the connector 11c. The configurations and functions of the components of the linear light-emitter 11" other than the pair of the connection pads 11s and 11t are the same as those of the components of the linear light-emitter 11', to which the same symbols area attached, and therefore detailed explanation thereof is omitted here.

Each of the pair of the connection pads 11s and 11t supplies power to each of the plurality of the light-emitting elements 11g mounted in the first and second light-emitting areas 11/1 and 11/2 by electrically connected with an electric wire, such as a cable, not shown schematically, by solder and etc.

In the present disclosure, the planar light-emitting device of the above embodiment may be appropriately modified as long as the modification does not deviate from the gist of the present disclosure. Further, the component of one modification may be applied to another modification.

For example, in the above embodiment, although the planar light-emitting device is used as the light source for illuminating the transmission-type display panel, such as a liquid crystal panel, from the backside, the usage of the planar light-emitting device disclosed in the present disclosure is not limited to the application. The planar light-emitting device disclosed in the present disclosure may be used as a light source emitting planar light. For example, the planar light-emitting device disclosed in the present disclosure may be used in a device that uses a light source emitting planar light, including an illumination device and an information display device.

Further, in the above embodiment, although the planar light-emitting device is an edge-type backlight device, the planar light-emitting device may be a direct-type backlight device.

Furthermore, in the embodiment described above, although the linear light-emitter has the light-emitting elements emitting light having similar wavelength, the linear light-emitter may have a plurality of kinds of light-emitting element emitting light having different wavelengths. For example, the linear light-emitter may have light-emitting elements emitting infrared light for which wavelength conversion is not performed by a phosphor included in the seal. The infrared light emitted from the light-emitting elements propagates the light guide plate together with light having another wavelength, and is emitted from the planar light-emitting device. The infrared light emitted from the planar light-emitting device may be used for performing biometric authentication, such as iris recognition.

Still furthermore, in the embodiment described above, although the incidence surface of the light guide plate has the projecting portion, the incidence surface may have a flat surface without having the projecting portion.

What is claimed is:

1. A planar light-emitting device comprising:
   a linear light-emitter comprising:
   a substrate extending in a predetermined direction;
   a first line and a second line including a plurality of light-emitting elements arranged along the predetermined direction on the substrate, the first line and the second line being arranged side by site along the predetermined direction with an interval;
   a first seal sealing the first line of the plurality of light-emitting elements;
   a second seal sealing the second line of the plurality of light-emitting elements; and
   a plurality of electrodes arranged on the substrate and electrically connected with the plurality of light-emitting elements; wherein
   a first frame and a second frame have a shape extending in the predetermined direction,
   the first frame includes a first portion arranged near one end portion close to the second frame in the predetermined direction and a second portion arranged near another end portion far from the second frame in the predetermined direction and transmittance of light of the first portion is higher than transmittance of the second portion, and
   the second frame includes a third portion arranged near one end portion close to the first frame in the predetermined direction and a fourth portion arranged near another end portion far from the first frame in the predetermined direction and transmittance of light of the third portion is higher than transmittance of the fourth portion.

2. The planar light-emitting device according to claim 1, wherein
   light-emission intensity of a first area of the first portion far from the second portion is lower than the light emission intensity of a second area of the first portion close to the second portion than the first light emitting area and
   light-emission intensity of a third area of the second portion close to the first portion is higher than light emission intensity of a fourth area of the second portion far from the first portion than the third area.

3. The planar light-emitting device according to claim 2, wherein
   the plurality of light-emitting elements included in the first line and the second line forms rows arranged side by side in the predetermined direction and
   in the rows, intervals between the light-emitting elements are different at least partially.

4. The planar light-emitting device according to claim 3, wherein
   in the first line, a first interval between the light-emitting elements arranged in the first area is longer than a second interval between the light-emitting elements arranged in the second area and in the second line, a third interval between the light-emitting elements arranged in the third area is narrower than a fourth interval between the light-emitting elements arranged in the fourth area.

5. The planar light-emitting device according to claim 2, wherein a height of the first frame is higher than a position of a surface of the first seal, and a height of the second frame is greater than a position of a surface of the second seal.

6. The planar light-emitting device comprising:

a linear light-emitter comprising:
- a substrate extending in a predetermined direction,
- a first line and a second line including a plurality of light-emitting elements arranged along the predetermined direction on the substrate, the first line and the second line being arranged side by site along the predetermined direction with an interval;
- a first seal sealing the first line of the plurality of light-emitting elements;
- a second seal sealing the second line of the plurality of light-emitting elements;
- a first seal arranged inside the first frame for sealing the plurality of light-emitting elements;
- a second seal arranged inside the second frame for sealing the plurality of light-emitting elements;
- a first seal arranged inside the first frame for sealing the plurality of light-emitting elements;
- a second seal arranged inside the second frame for sealing the plurality of light-emitting elements; and
- a plurality of electrodes arranged on the substrate and electrically connected with the plurality of light-emitting elements; and a light guide plate having an incidence surface having a first flat portion facing to the first line, a second flat portion facing to the second line, a projecting portion arranged between the first flat portion and the second flat portion and projecting toward the linear light-emitter, and an emission surface that emits light incident from the incidence surface, wherein the projecting portion has a first light-incoming surface arranged at an angle so as to face to an end portion of the first frame on the second frame side, and a second light-incoming surface arranged at an angle so as to face to an end portion of the second frame on the first frame side.

7. The planar light-emitting device according to claim 6, wherein an inner area of the first frame defines a first light-emitting area of the linear light emitter and an inner area of the second frame defines a second light-emitting area of the linear light emitter.

8. The planar light-emitting device according to claim 7, wherein the projecting portion is arranged so as to be close to an area between the first light-emitting area and the second light-emitting area.

9. The planar light-emitting device according to claim 7, wherein the projecting portion is arranged so as to be contacted with an area between the first light-emitting area and the second light-emitting.

10. The planar light-emitting device according to claim 7, wherein a height of the projection portion is higher than heights of the first frame and the second frame.

* * * * *